(12) United States Patent
Chiu et al.

(10) Patent No.: US 8,486,829 B2
(45) Date of Patent: Jul. 16, 2013

(54) SEMICONDUCTOR ELEMENT HAVING A CONDUCTIVE VIA AND METHOD FOR MAKING THE SAME AND PACKAGE HAVING A SEMICONDUCTOR ELEMENT WITH A CONDUCTIVE VIA

(71) Applicants: Chi-Tsung Chiu, Kaohsiung (TW); Ying-Te Ou, Kaohsiung (TW); Meng-Jen Wang, Kaohsiung (TW)

(72) Inventors: Chi-Tsung Chiu, Kaohsiung (TW); Ying-Te Ou, Kaohsiung (TW); Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/720,559

(22) Filed: Dec. 19, 2012

(65) Prior Publication Data

US 2013/0109178 A1    May 2, 2013

Related U.S. Application Data

(62) Division of application No. 12/830,964, filed on Jul. 6, 2010, now Pat. No. 8,350,361.

(30) Foreign Application Priority Data

Sep. 23, 2009    (TW) ............................. 98132084 A

(51) Int. Cl.
H01L 21/44    (2006.01)
(52) U.S. Cl.
USPC .... 438/667; 257/621; 257/698; 257/E23.011; 257/E21.597
(58) Field of Classification Search
USPC .................. 438/667; 257/621, 698, E23.011, 257/E21.597
See application file for complete search history.

(56) References Cited

U.S. PATENT DOCUMENTS

| | | | |
|---|---|---|---|
| 6,943,067 B2 * | 9/2005 | Greenlaw | 438/152 |
| 2001/0001292 A1 | 5/2001 | Bertin et al. | |
| 2009/0140394 A1 | 6/2009 | Bathan et al. | |

FOREIGN PATENT DOCUMENTS

| | | |
|---|---|---|
| CN | 101281883 | 10/2008 |
| CN | 101483150 | 7/2009 |

OTHER PUBLICATIONS

Office action issued by the State Intellectual Patent Office (SIPO) No. 200233, CN Application No. 200910208066.9, dated Dec. 13, 2011, pp. 1-6, and Summary of Office action issued on Dec. 13, 2011, 1 page.

* cited by examiner

*Primary Examiner* — Tu-Tu Ho
(74) *Attorney, Agent, or Firm* — McCracken & Frank LLC

(57) ABSTRACT

The present invention relates to a semiconductor element having a conductive via and a method for making the same and a package having a semiconductor element with a conductive via. The semiconductor element includes a silicon chip and at least one conductive via. The silicon chip includes a silicon substrate and an active circuit layer. The active circuit layer is disposed on a second surface of the silicon substrate, and has at least one metal layer. The conductive via penetrates the silicon substrate, and includes a conductive metal, The conductive metal electrically connects to the metal layer of the active circuit layer, and a surface of the conductive metal is exposed to the outside of a first surface of the silicon substrate. Therefore, a chip is able to be directly stacked on the semiconductor element without forming a passivation layer and a redistribution layer on the first surface of the silicon substrate, and the process is simplified and the manufacturing cost is decreased.

6 Claims, 19 Drawing Sheets

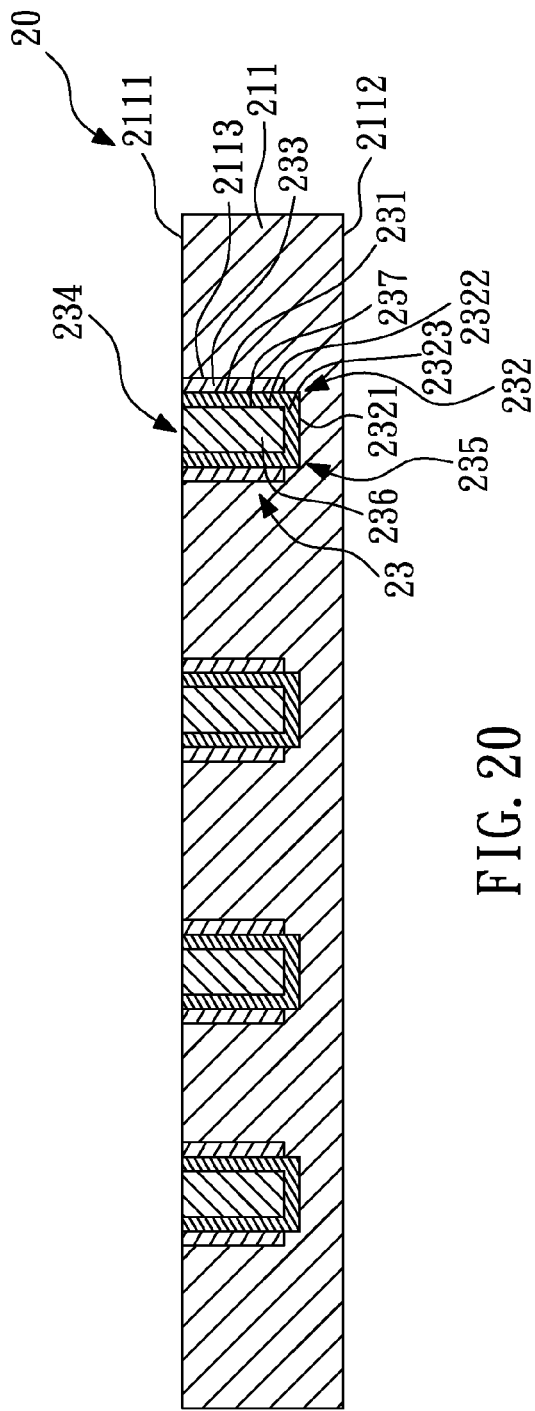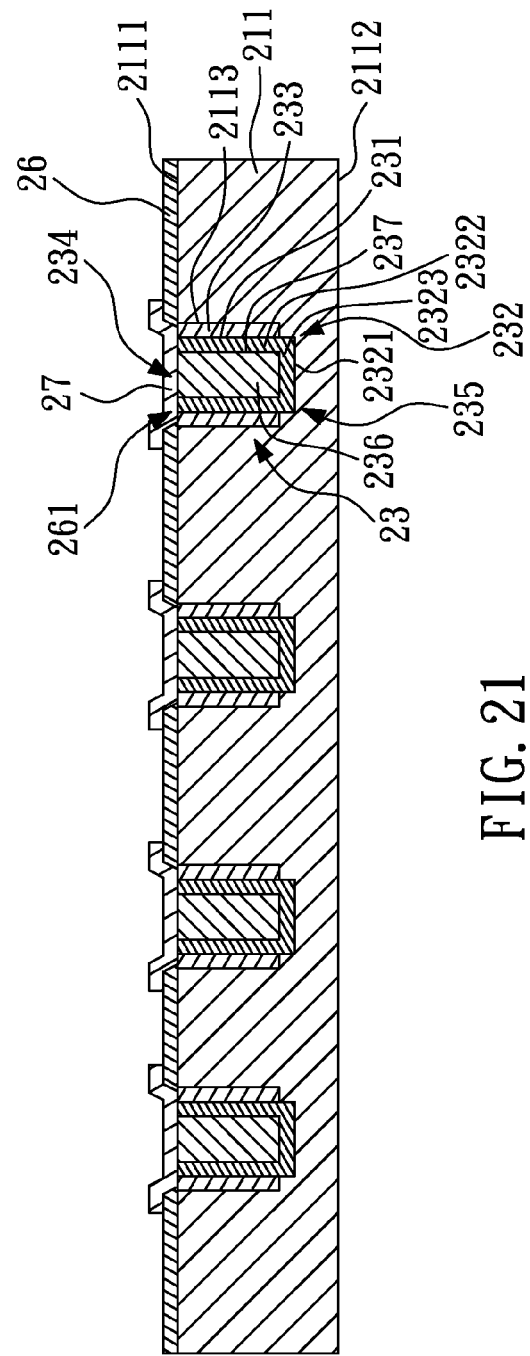

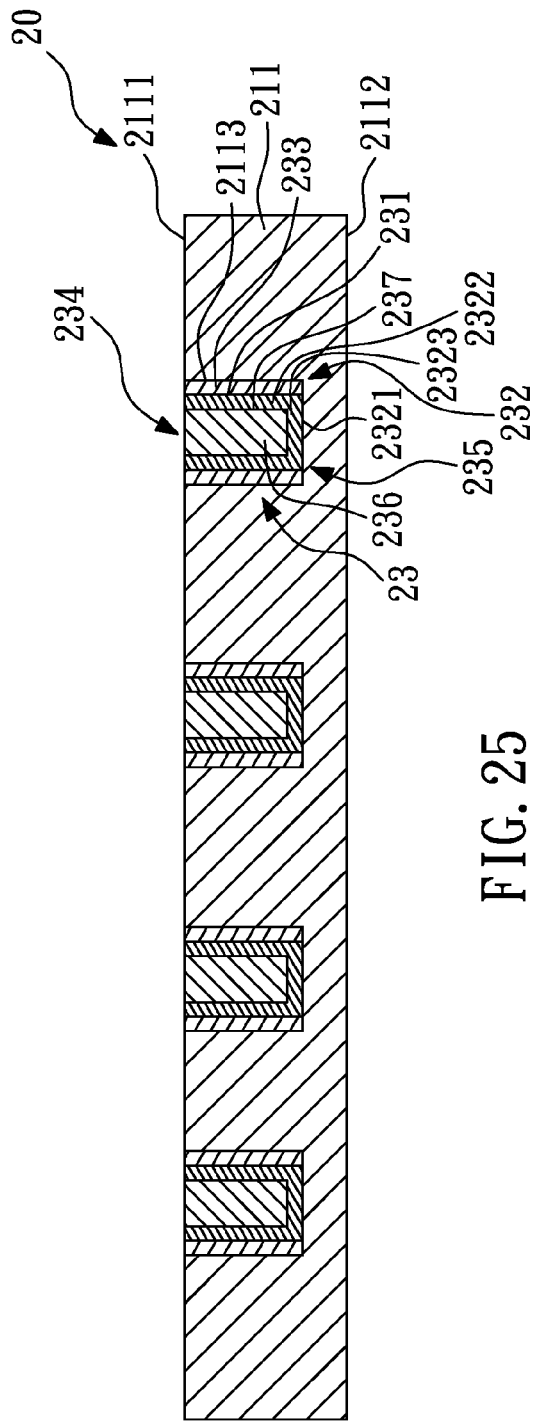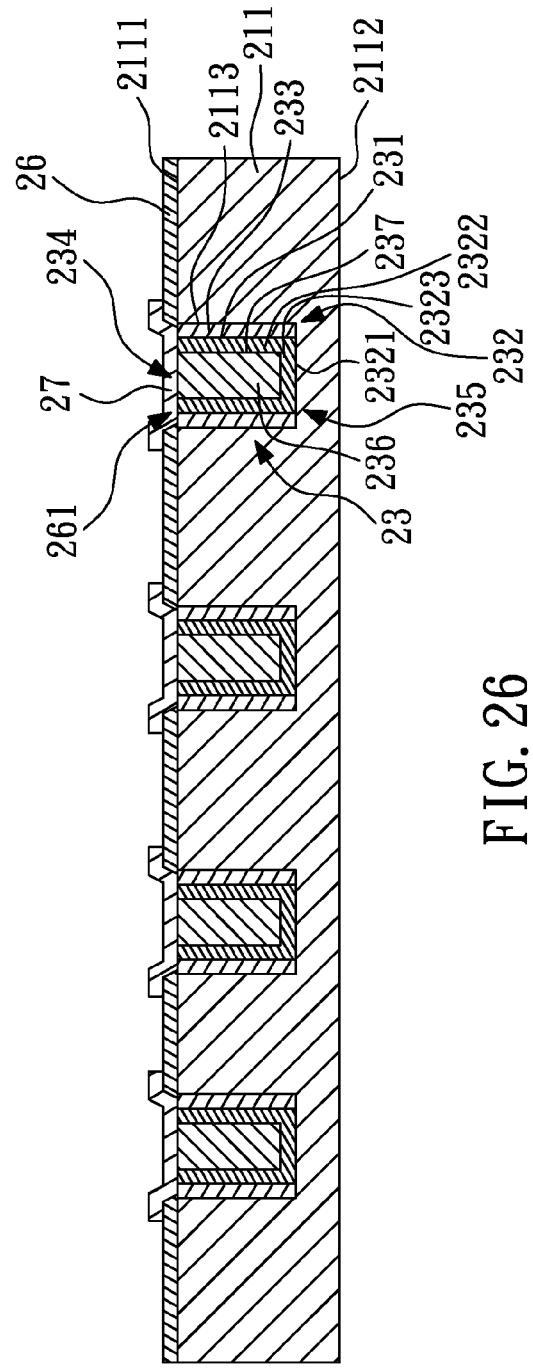

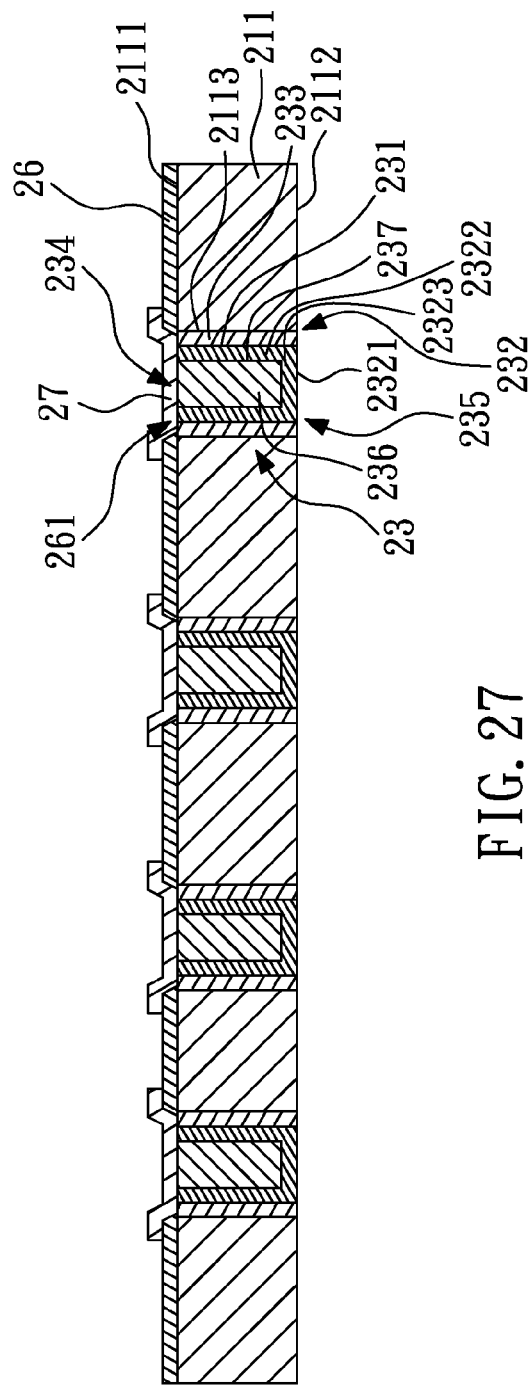
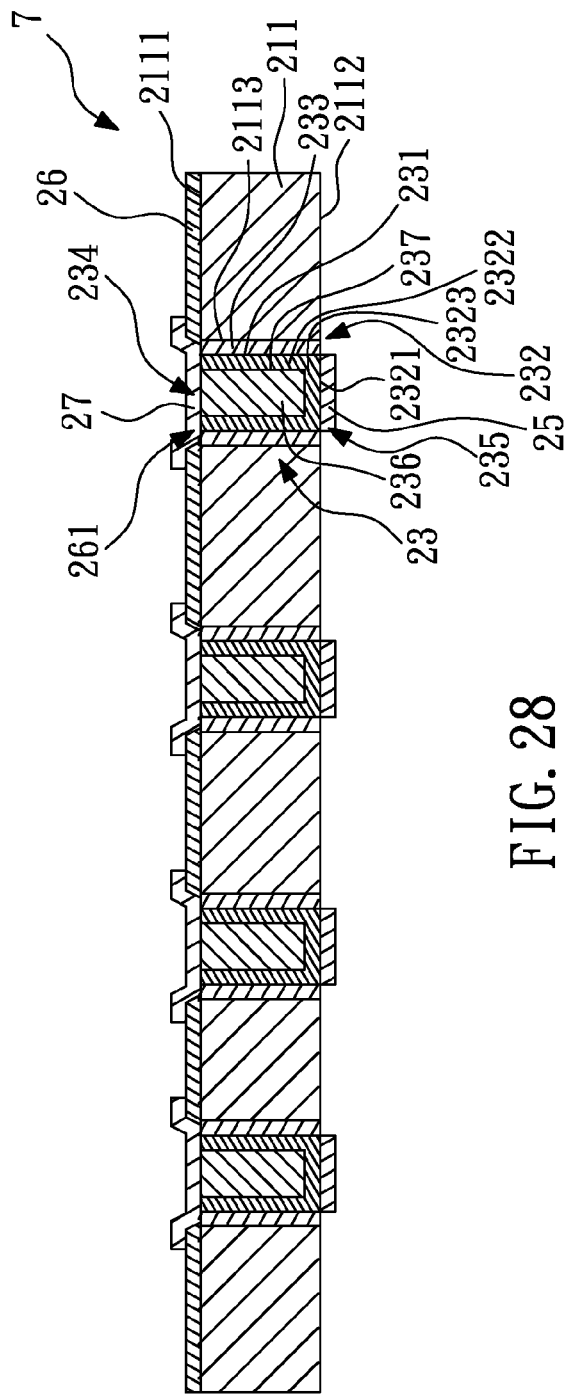

SEMICONDUCTOR ELEMENT HAVING A CONDUCTIVE VIA AND METHOD FOR MAKING THE SAME AND PACKAGE HAVING A SEMICONDUCTOR ELEMENT WITH A CONDUCTIVE VIA

CROSS-REFERENCE TO RELATED APPLICATIONS

The present application is a divisional application of U.S. patent application Ser. No. 12/830,964 filed on Jul. 6, 2010, and is hereby incorporated by reference herein in its entirety.

BACKGROUND OF THE INVENTION

1. Field of the Invention

The present invention relates to a semiconductor element and method for making the same and package having a semiconductor element, and more particularly to a semiconductor element having a conductive via and method for making the same and package having a semiconductor element with a conductive via.

2. Description of the Related Art

FIG. 1 shows a cross-sectional view of a conventional semiconductor element having a conductive via. The semiconductor element 1 includes a silicon substrate 11 and at least one conductive via 12. The silicon substrate 11 has a first surface 111, a second surface 112 and at least one through hole 113. The through hole 113 penetrates the silicon substrate 11. The conductive via 12 penetrates the silicon substrate 11 and includes an insulation layer 121 and a conductive metal 122. The insulation layer 121 is disposed on a sidewall of the through hole 113 and defines a central groove 124. The conductive The conventional semiconductor element 1 has the following disadvantages. When the conventional semiconductor element 1 is required to be electrically connected to another element (not shown), a redistribution layer (not shown) must be formed on the both sides (the first surface 111 and the second surface 112) of the silicon substrate 11. However, it is costly to form the redistribution layer, and it is not easy to fix the redistribution layer on the silicon substrate 11, thus the yield rate is low.

Therefore, it is necessary to provide a semiconductor element having a conductive via and method for making the same and package having a semiconductor element with a conductive via to solve the above problems.

SUMMARY OF THE INVENTION

The present invention is directed to a semiconductor element having a conductive via, The semiconductor element comprises a silicon substrate and at least one conductive via. The silicon substrate has a first surface, a second surface and at least one through hole, and the at least one through hole penetrates the silicon substrate. The conductive via penetrates the silicon substrate and comprises a first insulation layer, a conductive metal and a second insulation layer. The first insulation layer is disposed on a sidewall of the through hole and defining a first central groove. The conductive metal is disposed in the first central groove and has an annular side portion and a bottom portion. The annular side portion and the bottom portion defines a second central groove, and a bottom surface of the bottom portion exposes to outside of the second surface of the silicon substrate. The second insulation layer is disposed in the second central groove.

The present invention is further directed to a method for making a semiconductor element having a conductive via, comprising the following steps: (a) providing a semiconductor element comprising a silicon substrate and at least one conductive via, the silicon substrate having a first surface, a second surface and at least one hole, the at least one hole opening at the first surface, the conductive via being disposed in the hole and comprising a first insulation layer, a conductive metal and a second insulation layer, the first insulation layer being disposed on a sidewall of the through hole and defining a first central groove, the conductive metal being disposed in the first central groove and having an annular side portion and a bottom portion, the annular side portion and the bottom portion defining a second central groove, the second insulation layer being disposed in the second central groove; and (h) removing part of the silicon substrate from the second surface of the silicon substrate, so as to expose a bottom surface of the bottom portion of the conductive metal.

Whereby, the bottom surface of the bottom portion of the conductive metal exposes to outside of the second surface of the silicon substrate, and can be stacked on a carrier. It is not necessary to from a passivation layer and a redistribution layer on the second surface of the silicon substrate, thus the manufacture process is simplified and the manufacture cost is reduced. In addition, the present invention can avoid the low yield rate caused by the low bonding force between the redistribution layer on the first and second surfaces of the silicon substrate in the prior art.

The present invention is further directed to a semiconductor element having a conductive via. The semiconductor element comprises a silicon chip and at least one conductive via. The silicon chip comprises a silicon substrate and an active circuit layer. The silicon substrate has a first surface, a second surface and at least one through hole. The through hole penetrates the silicon substrate. The active circuit layer is disposed on the second surface of the silicon substrate, and has at least one metal layer and an opening. The position of the opening corresponds to the through hole of the silicon substrate, and the and the opening exposes part of the metal layer. The conductive via penetrates the silicon substrate and comprises a first insulation layer and a conductive metal. The first insulation layer is disposed on a sidewall of the through hole and defines a first central groove. The conductive metal is disposed in the first central groove and the opening of the active circuit layer, and is electrically connected to the metal layer of the active circuit layer. A surface of the conductive metal exposes to outside of the first surface of the silicon substrate.

The present invention is further directed to a method for making a semiconductor element having a conductive via, comprising the following steps: (a) providing a silicon chip comprising a silicon substrate and an active circuit layer, the silicon substrate having a first surface and a second surface, the active circuit layer being disposed on the second surface of the silicon substrate, and having at least one metal layer; (b) removing part of the silicon substrate and part of the active circuit layer from the first surface of the silicon substrate, to form at least one columnar groove and at least one opening, respectively, the columnar groove penetrating the silicon substrate, and the opening exposing part of the metal layer; (c) forming a conductive metal in the columnar groove and the opening, the conductive metal being electrically connected to the metal layer of the active circuit layer, and a surface of the conductive metal exposing to outside of the first surface of the silicon substrate; (d) removing part of the silicon substrate from the first surface of the silicon substrate, to form at least one annular groove, the annular groove penetrating the silicon substrate and surrounding the conductive metal; and (e) forming a first insulation layer in the annular groove, so that the conductive metal and the first insulation layer forming at least one conductive via, Whereby, the surface of the conductive metal exposes to outside of the first surface of the silicon substrate, and can be stacked by a chip. It is not necessary to from a passivation layer and a redistribution layer on the first surface of the silicon substrate, thus the manufacture process is simplified and the manufacture cost is reduced. In addition, the thickness of the first insulation layer is 10 µm to 20 µm, therefore, when a chip stacks on the first insulation layer, the solder of the chip will not bleed to cause bridge.

The present invention is further directed to a package having a semiconductor element with a conductive via, The package comprises at least one carrier, a semiconductor element and at least one chip. The semiconductor element is disposed on the carrier and comprises a silicon substrate and at least one conductive via, The silicon substrate has a first surface, a second surface and at least one through hole. The through hole penetrates the silicon substrate, The conductive via penetrates the silicon substrate and comprises a first insulation layer and a conductive metal. The first insulation layer is disposed on a sidewall of the through hole and defines a first central groove, The conductive metal is disposed in the first central groove, and a surface of the conductive metal exposes to outside of the silicon substrate. The chip is disposed on the semiconductor element, and electrically connected to the carrier by the conductive metal of the conductive via.

BRIEF DESCRIPTION OF THE DRAWINGS

FIGS. 20 to 23 are cross-sectional views showing a method for making a semiconductor element having a conductive via according to a third embodiment of the present invention;

FIGS. 25 to 28 are cross-sectional views showing a method for making a semiconductor element having a conductive via according to a fifth embodiment of the present invention;

DETAILED DESCRIPTION OF THE INVENTION

FIGS. 2 to 15 shows cross-sectional views of a method for making a semiconductor element having a conductive via according to a first embodiment of the present invention.

Figure 1:
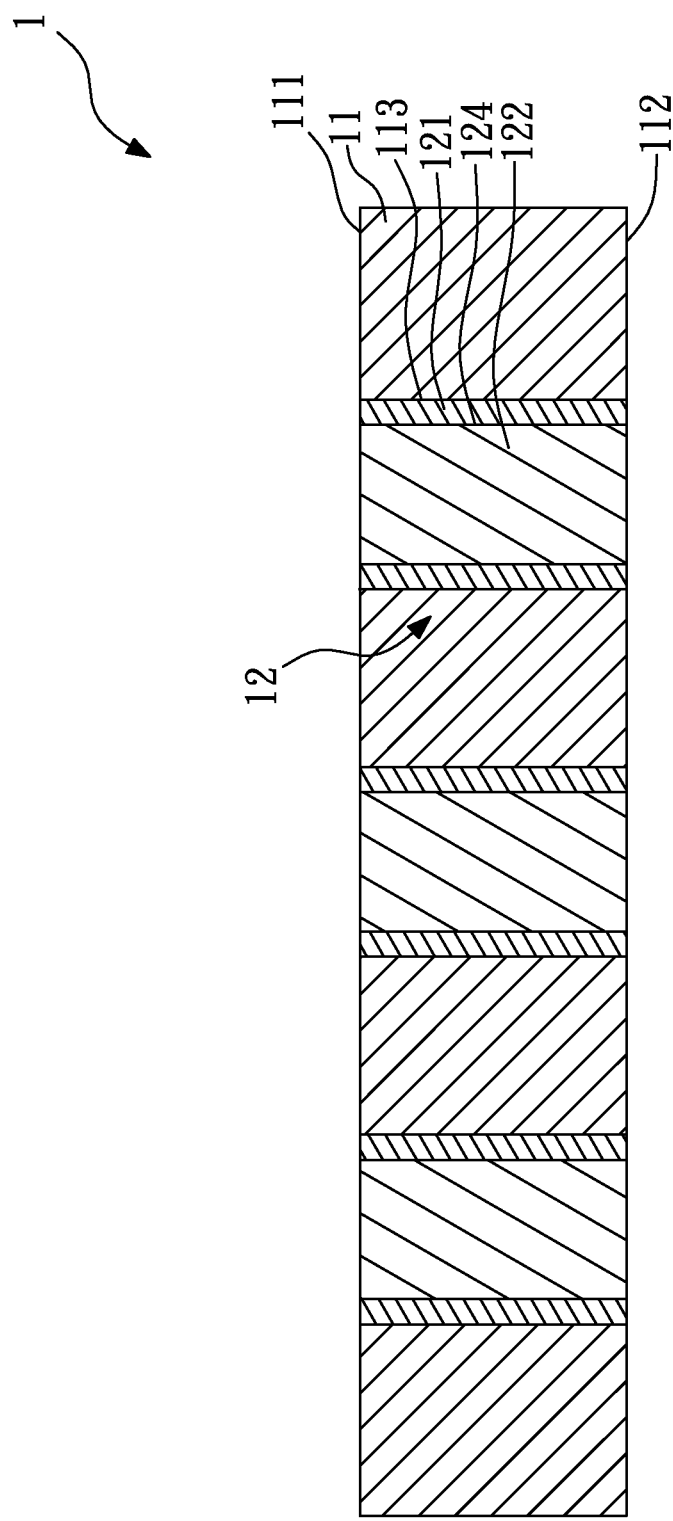
FIG. 1 is a cross-sectional view of a conventional semiconductor element having a conductive via.
Figure 2:
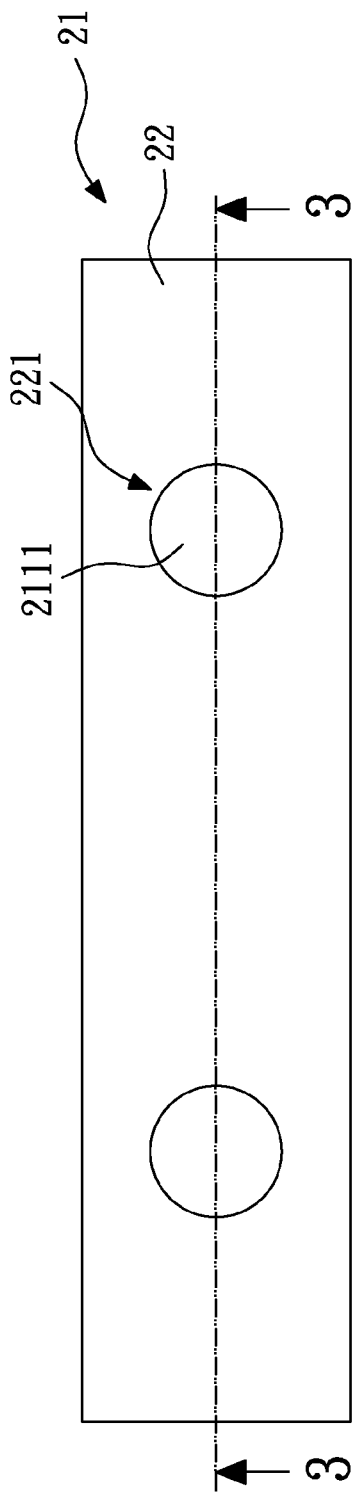
FIGS. 2 to 17 are cross-sectional views showing a method for making a semiconductor element having a conductive via according to a first embodiment of the present invention.
Figure 3:
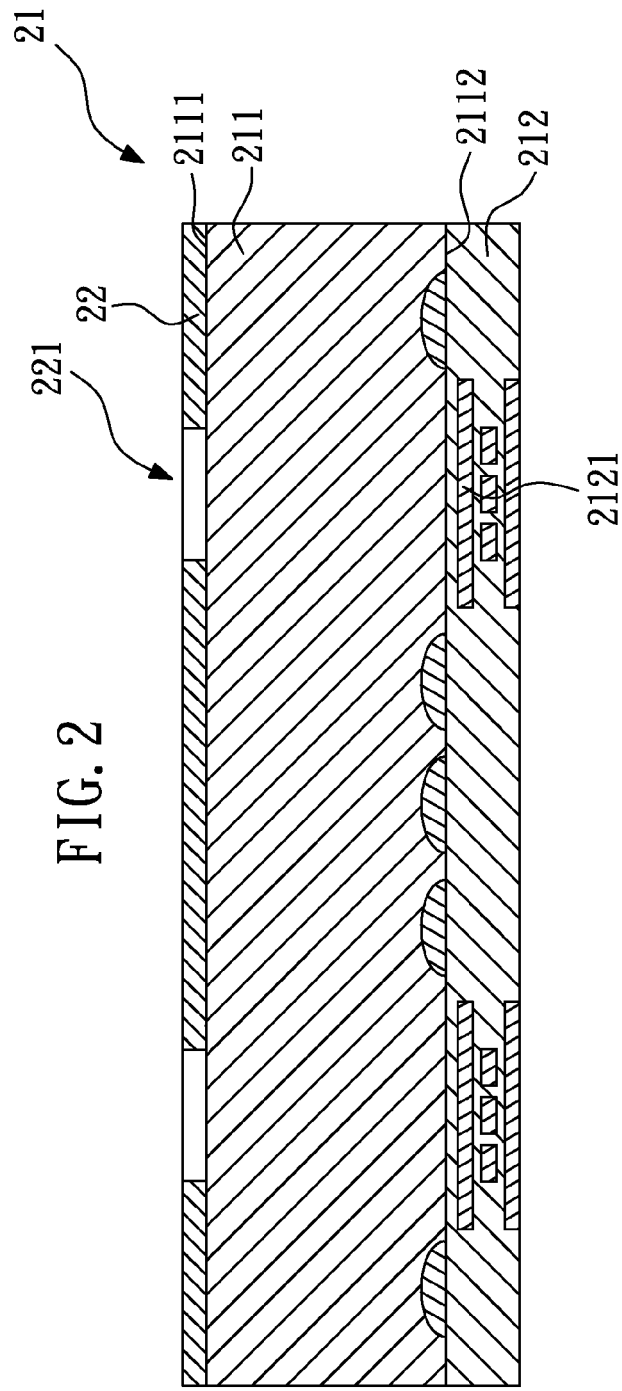

Referring to FIGS. 2 and 3, a silicon chip 21 is provided. The silicon chip 21 comprises a silicon substrate 211 and an active circuit layer 212. The silicon substrate 211 has a first surface 2111 and a second surface 2112. The active circuit layer 212 is disposed on the second surface 2112 of the silicon substrate 211, and has at least one metal layer 2121. Preferably, a first photo-resist layer 22 is formed on the first surface 2111 of the silicon substrate 211. The first photo-resist layer 22 has a first opening 221 to expose part of the first surface 2111 of the silicon substrate 211.

Figure 4:
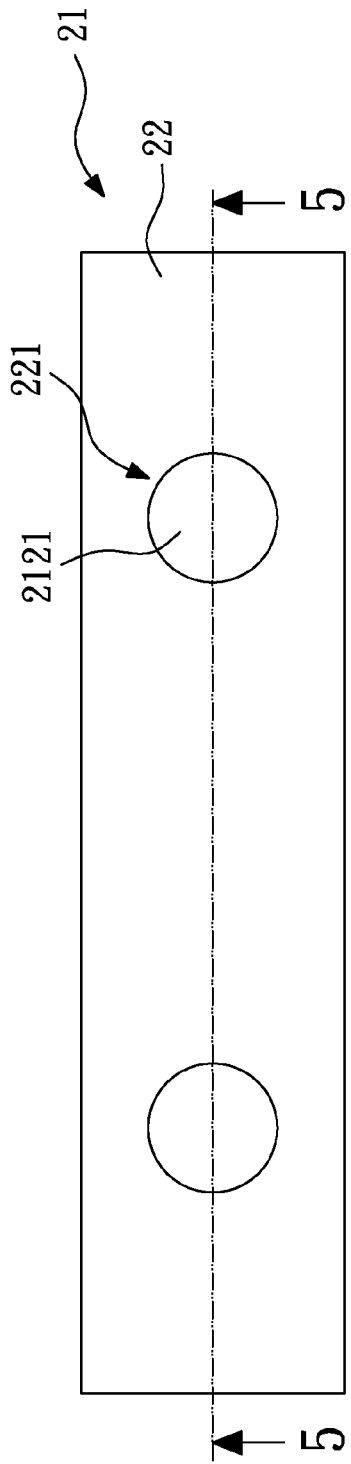
Figure 5:
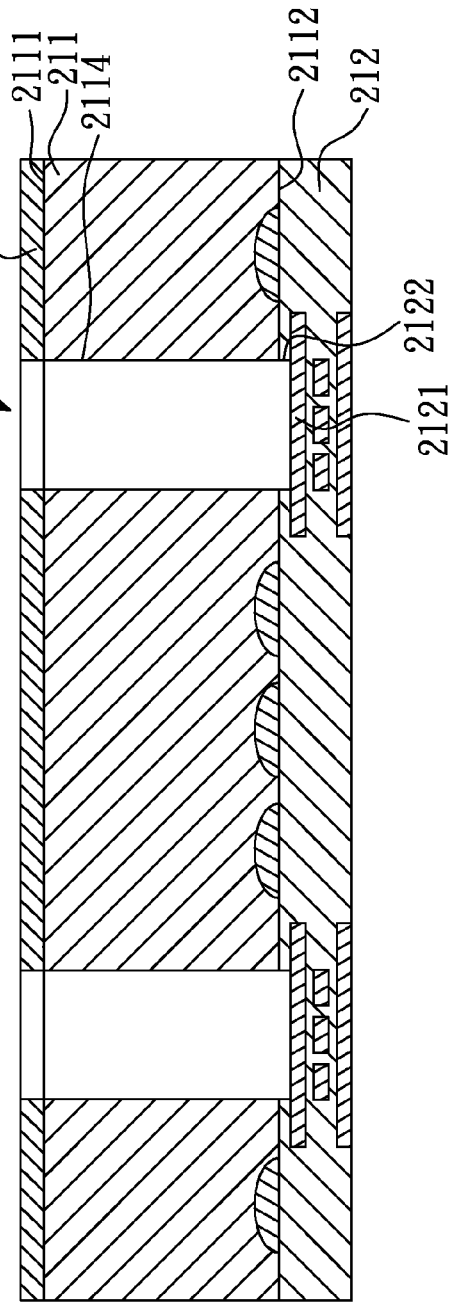
Figure 6:
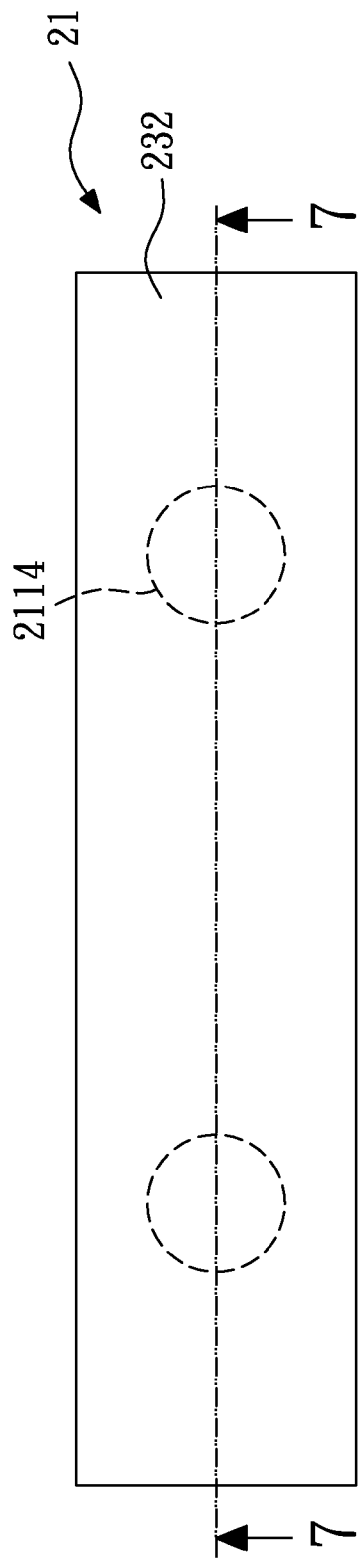
Figure 7:
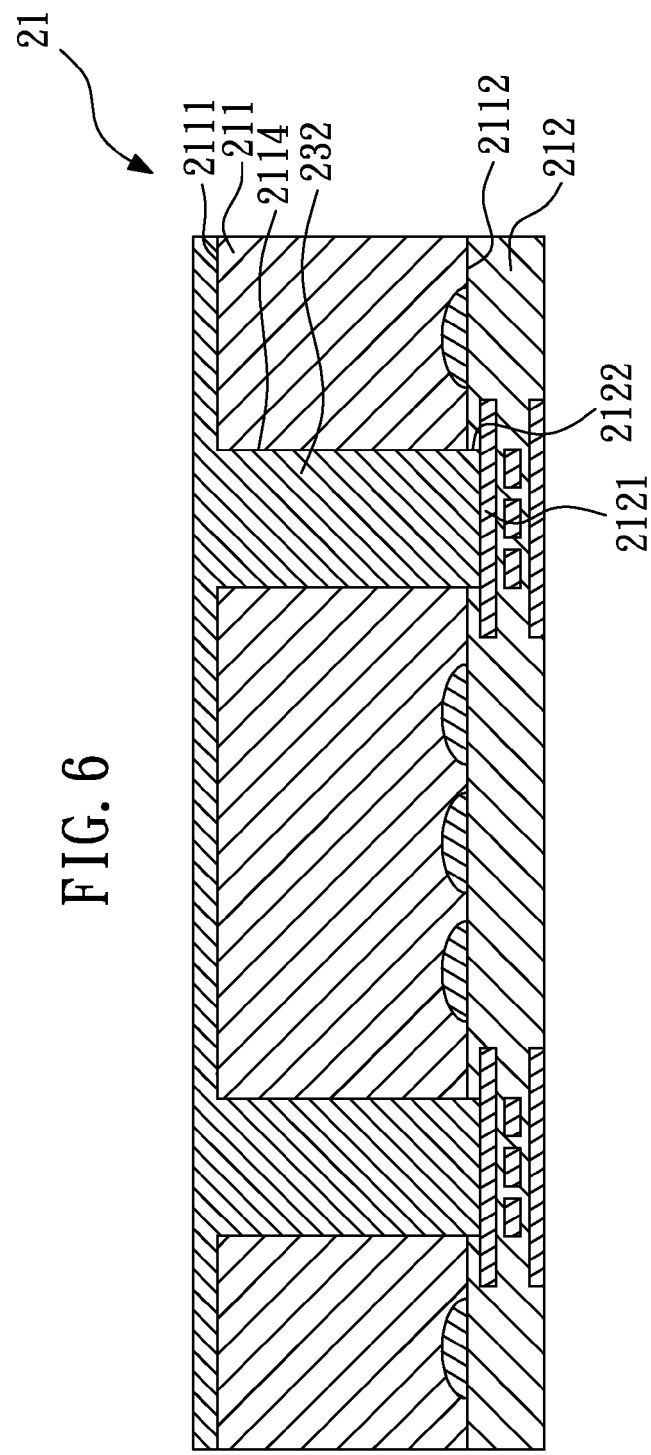
Figure 8:
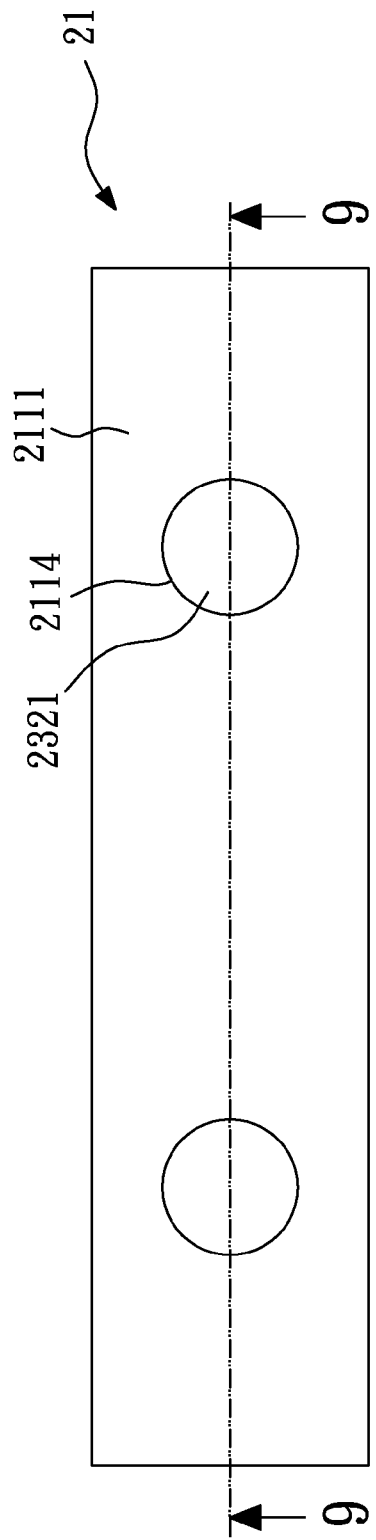
Figure 9:
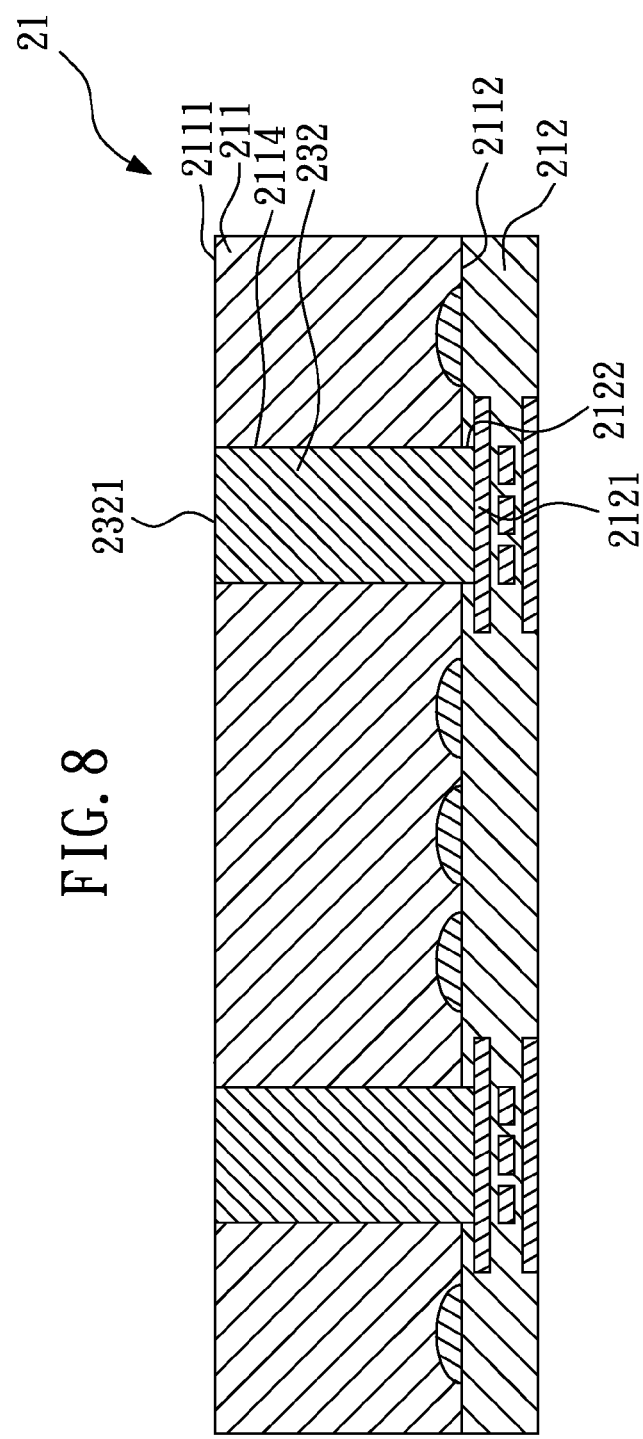

Referring to FIGS. 4 and 5, part of the silicon substrate 211 and part of the active circuit layer 212 are removed from the first surface 2111 of the silicon substrate 211 according to the first opening 221, so as to form at least one columnar groove 2114 and at least one opening 2122, respectively. The columnar groove 2114 penetrates the silicon substrate 211, and the opening 2122 exposes part of the metal layer 2121. Referring to FIGS. 6 and 7, the first photo-resist layer 22 is removed and a conductive metal 232 is plated. The conductive metal 232 is formed on the first surface 2111 of the silicon substrate 211 and fills up the columnar groove 2114 and the opening 2122. Referring to FIGS. 8 and 9, the conductive metal 232 on the first surface 2111 of the silicon substrate 211 is removed, and only the conductive metal 232 in the columnar groove 2114 and the opening 2122 is remained, The conductive metal 232 is electrically connected to the metal layer 2121 of the active circuit layer 212, and a surface 2321 of the conductive metal 232 exposes to outside of the first surface 2111 of the silicon substrate 211.

Figure 10:
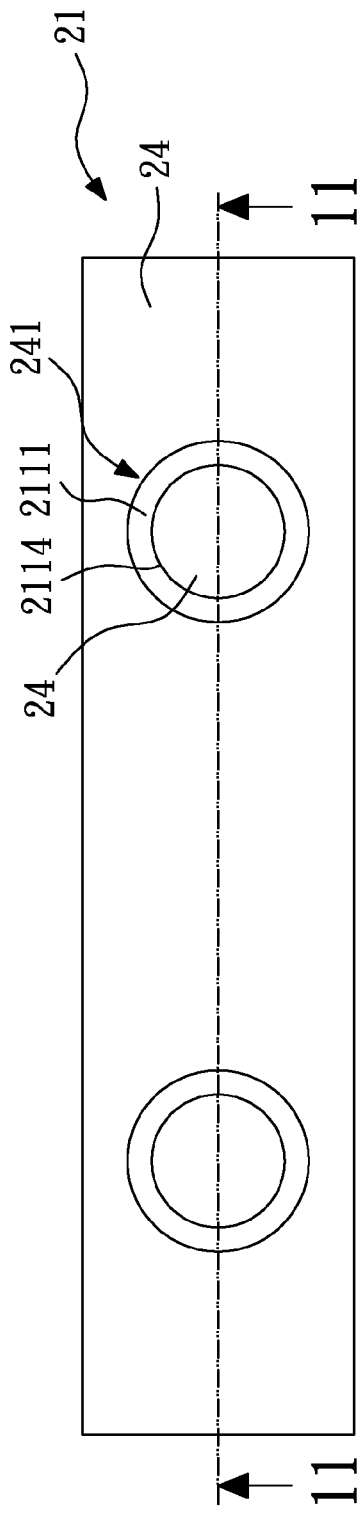
Figure 11:
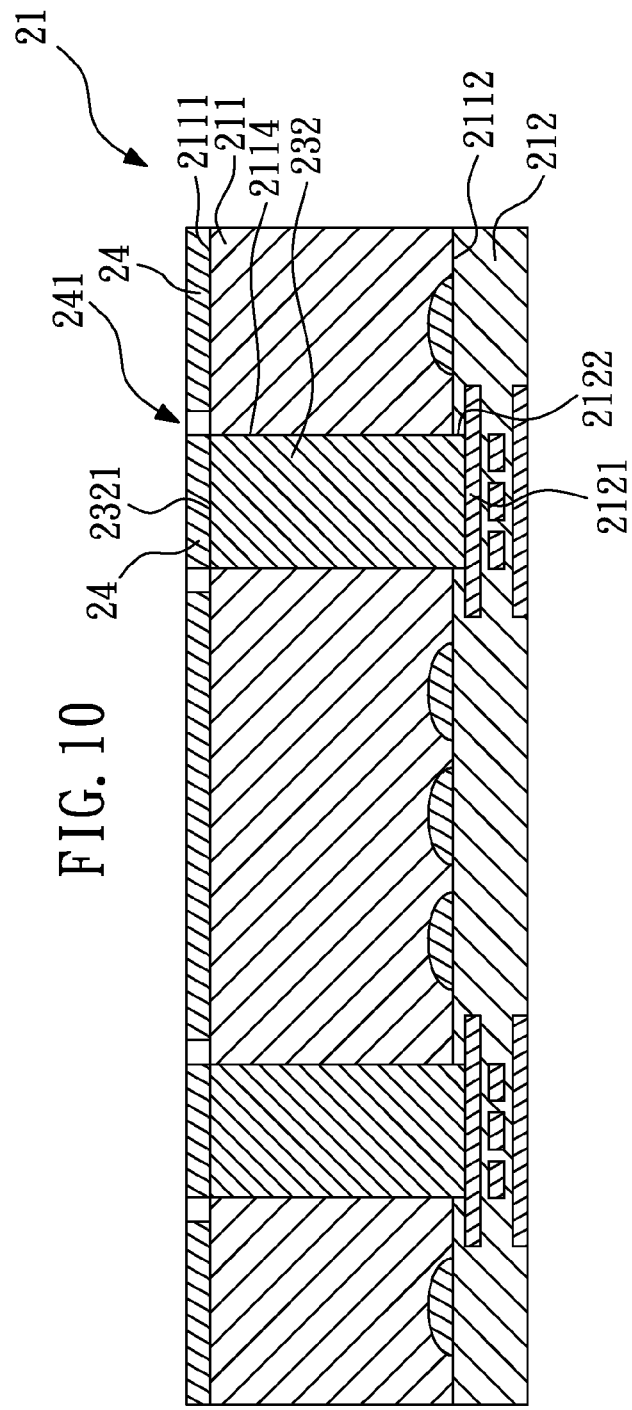
Figure 12:
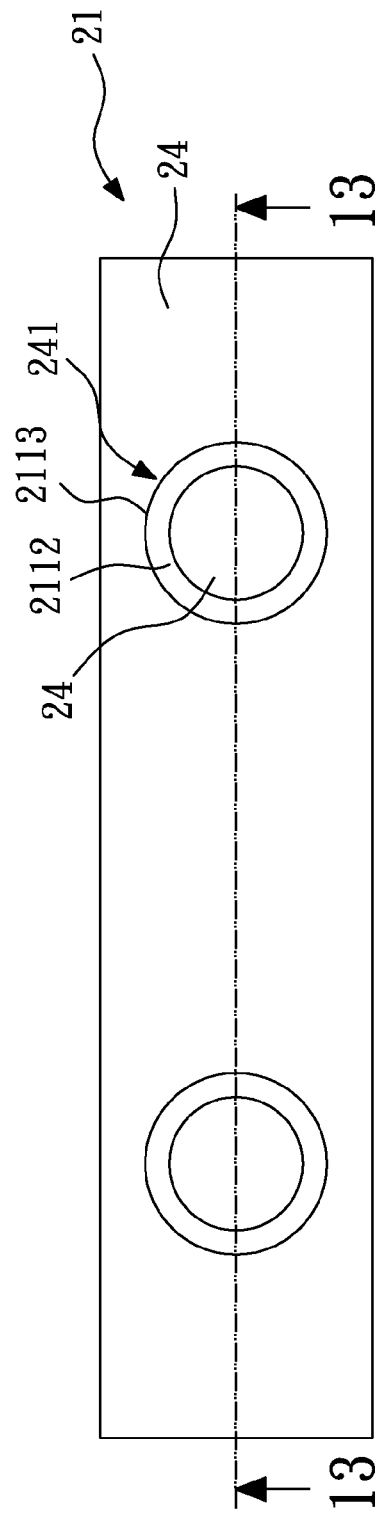
Figure 13:
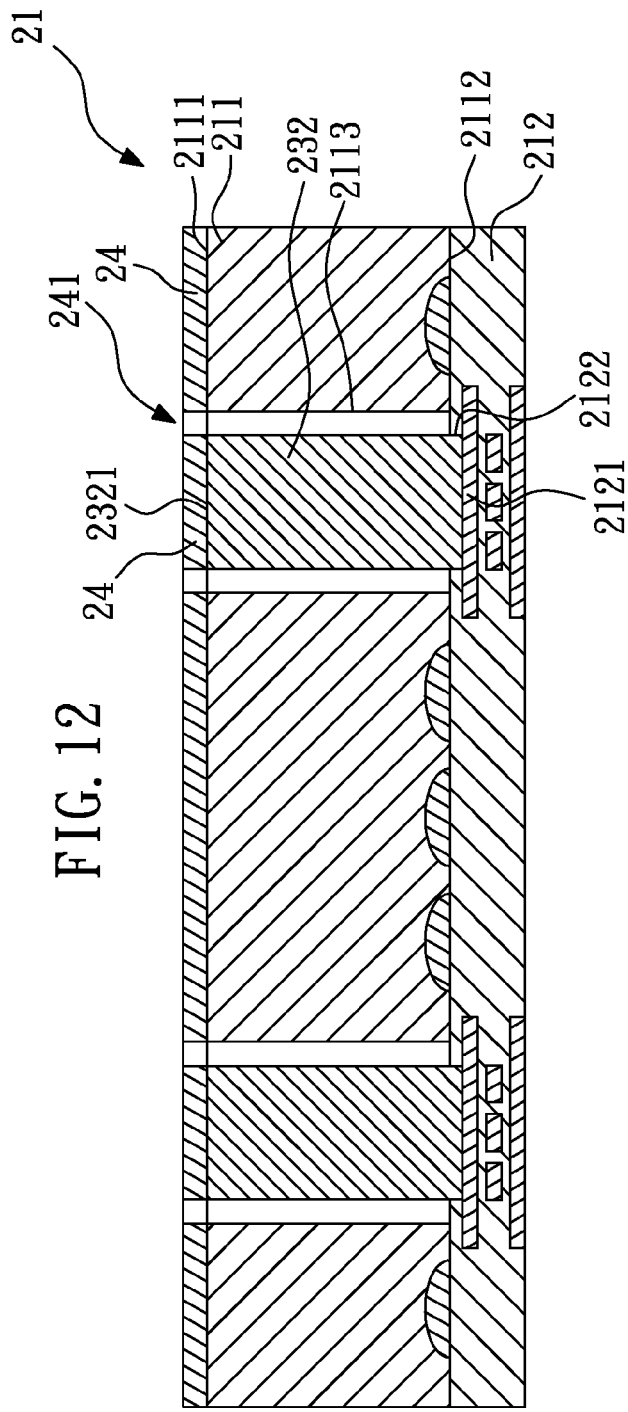
Figure 14:
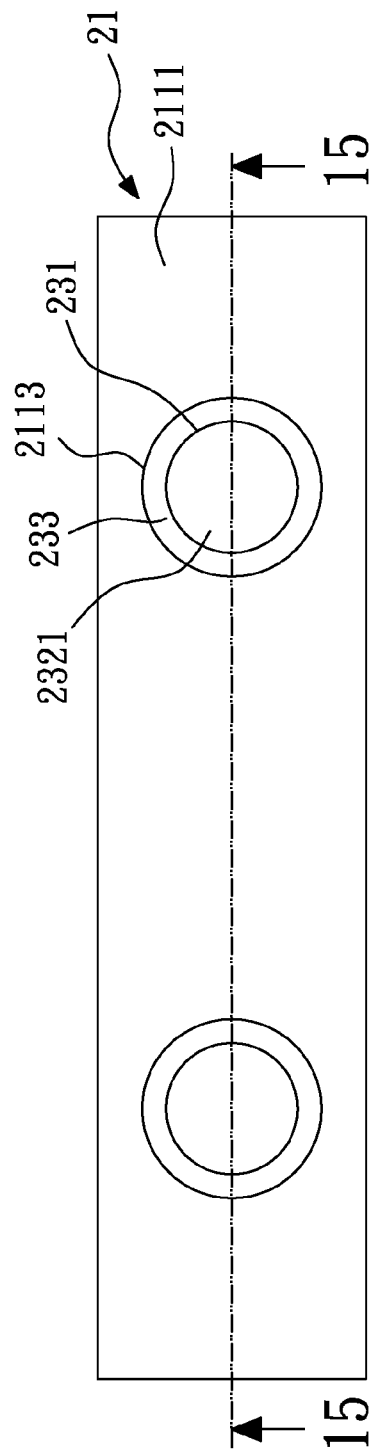
Figure 15:
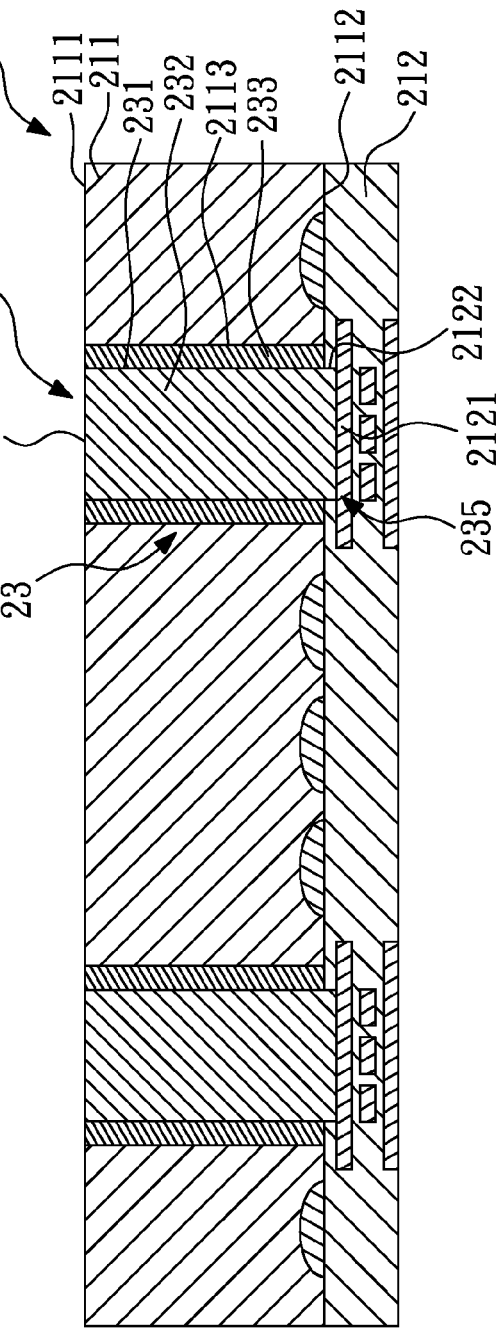

Referring to FIGS. 10 and 11, a second photo-resist layer 24 is formed on the first surface 2111 of the silicon substrate 211. The second photo-resist layer 24 has a second opening 241 to expose part of the first surface 2111 of the silicon substrate 211. Referring to FIGS. 12 and 13, part of the silicon substrate 211 is removed from the first surface 2111 of the silicon substrate 211, so as to form at least one annular groove 2113. The annular groove 2113 penetrates the silicon substrate 211 and surrounds the conductive metal 232. Referring to FIGS. 14 and 15, the second photo-resist layer 24 is removed and a first insulation layer 233 is formed in the annular groove 2113. The first insulation layer 233 defines a first central groove 231, The conductive metal 232 and the first insulation layer 233 form at least one conductive via 23.

Figure 16:
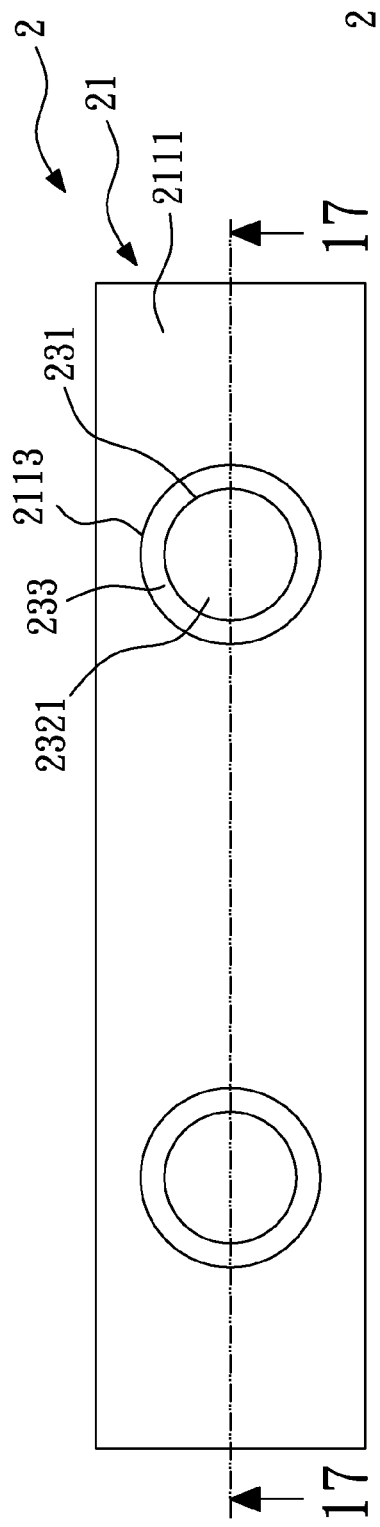
Figure 17:
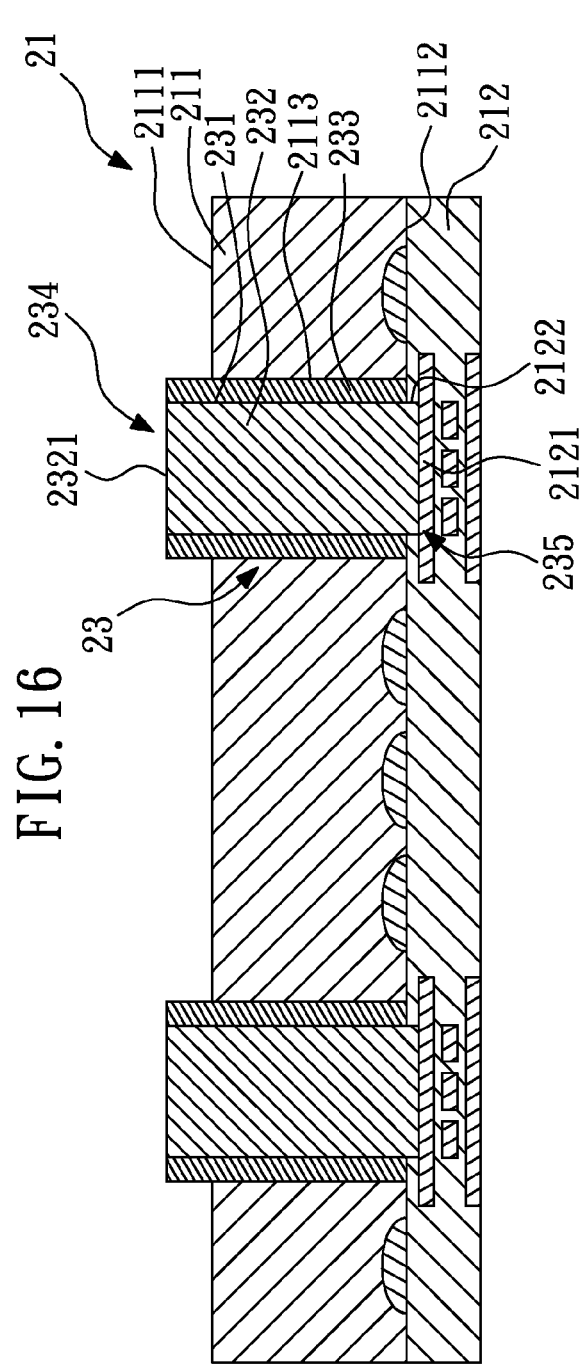
Figure 18:
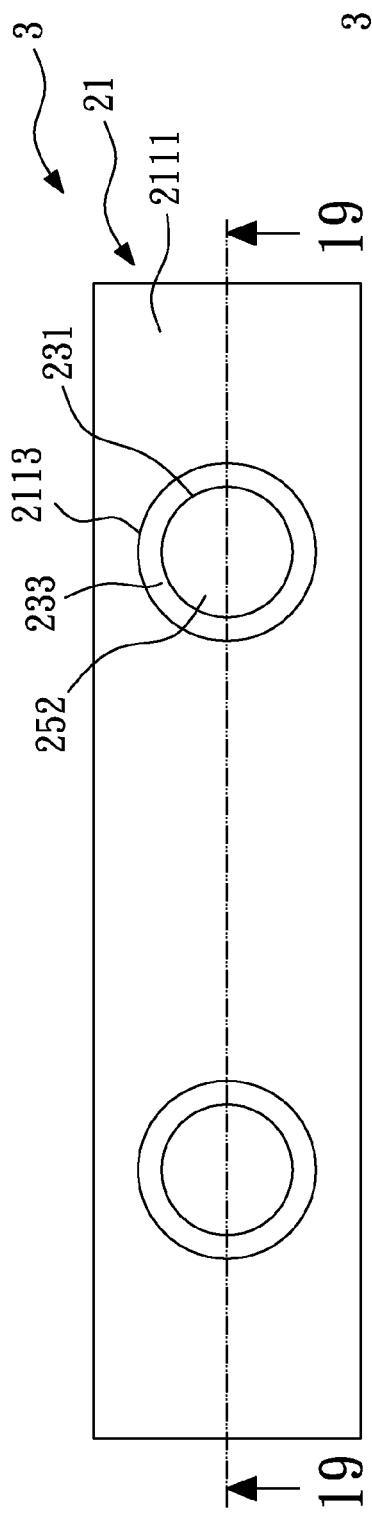
FIGS. 18 to 19 are cross-sectional views of a semiconductor element having a conductive via according to a second embodiment of the present invention.
Figure 19:
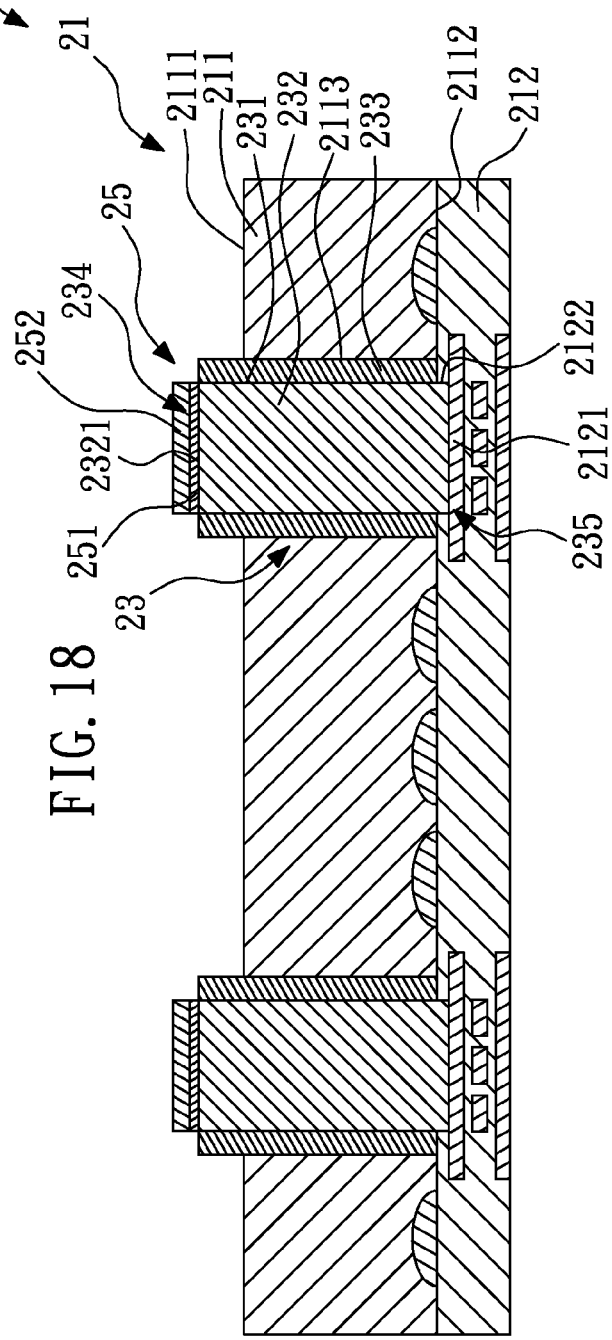

Referring to FIGS. 16 and 17, part of the silicon substrate 211 is removed, so that a first end 234 of the conductive via 23 protrudes from the first surface 2111 of the silicon substrate 211. Meanwhile, a semiconductor element 2 having a conductive via according to a first embodiment of the present invention is formed. Referring to FIGS. 18 and 19, at least one surface metal layer 25 is formed, wherein the surface metal layer 25 is disposed on the surface 2321 of the conductive metal 232. Meanwhile, a semiconductor element 3 having a conductive via according to a second embodiment of the present invention is formed. In this embodiment, the surface metal layer 25 is a surface finish layer, and is formed by electroless plating, and the material thereof is Ni/Au. However, in other embodiments, the surface metal layer 25 can be a solder layer, and is formed directly without removing part of the silicon substrate 211, thus, the surface metal layer 25 is disposed on the surface 2321 of the conductive metal 232.

FIGS. 16 and 17 show a top view and cross-sectional view of a semiconductor element having a conductive via according to a first embodiment of the present invention, respectively, The semiconductor element 2 comprises a silicon chip 21 and at least one conductive via 23. The silicon chip 21 comprised a silicon substrate 211 and an active circuit layer 212. The silicon substrate 211 has a first surface 2111, a second surface 2112 and at least one through hole (i.e., the outer surface of the annular groove 2113). The through hole (i.e., the outer surface of the annular groove 2113) penetrates the silicon substrate 211. The active circuit layer 212 is disposed on the second surface 2112 of the silicon substrate 211, and has at least one metal layer 2121 and an opening 2122. The position of the opening 2122 corresponds to the through hole (i.e., the outer surface of the annular groove 2113) of the silicon substrate 211, and the opening 2122 exposes part of the metal layer 2121.

The conductive via 23 penetrates the silicon substrate 211, and comprises a first insulation layer 233 and a conductive metal 232, In this embodiment, the conductive via 23 has a first end 234 and a second end 235, and the first end 234 of the conductive via 23 protrudes from the first surface 2111 of the silicon substrate 211, However, in other embodiments, the first end 234 of the conductive via 23 can be aligned with the first surface 2111 of the silicon substrate 211, as shown in FIG. 15. The first insulation layer 233 is disposed on a sidewall of the through hole (i.e., the outer surface of the annular groove 2113) and defines a first central groove 231. In this embodiment, the first insulation layer 233 is aligned with the second surface 2112 of the silicon substrate 211. The conductive metal 232 is disposed in the first central groove 231 and the opening 2122 of the active circuit layer 212, and is electrically connected to the metal layer 2121 of the active circuit layer 212. A surface 2321 of the conductive metal 232 exposes to outside of the first surface 2111. of the silicon substrate 211.

FIGS. 18 to 19 show cross-sectional views of a semiconductor element having a conductive via according to a second embodiment of the present invention. The semiconductor element 3 of the second embodiment and the semiconductor element 2 (FIGS. 14 and 15) of the first embodiment are substantially the same, and the same elements are designated with the same numerals. The difference between the second embodiment and the first embodiment is that the semiconductor element 3 further comprises a surface metal layer 25 disposed on a surface 2321 of the conductive metal 232. In this embodiment, the surface metal layer 25 is a surface finish layer, and includes a first layer 251 and a second layer 252. The first layer 251 is disposed on the surface 2321 of the conductive metal 232, and the material thereof is Ni. The second layer 252 is disposed on the first layer 251, and the material thereof is Au. However, in other embodiments, the surface metal layer 25 can be a solder layer.

Figure 30:
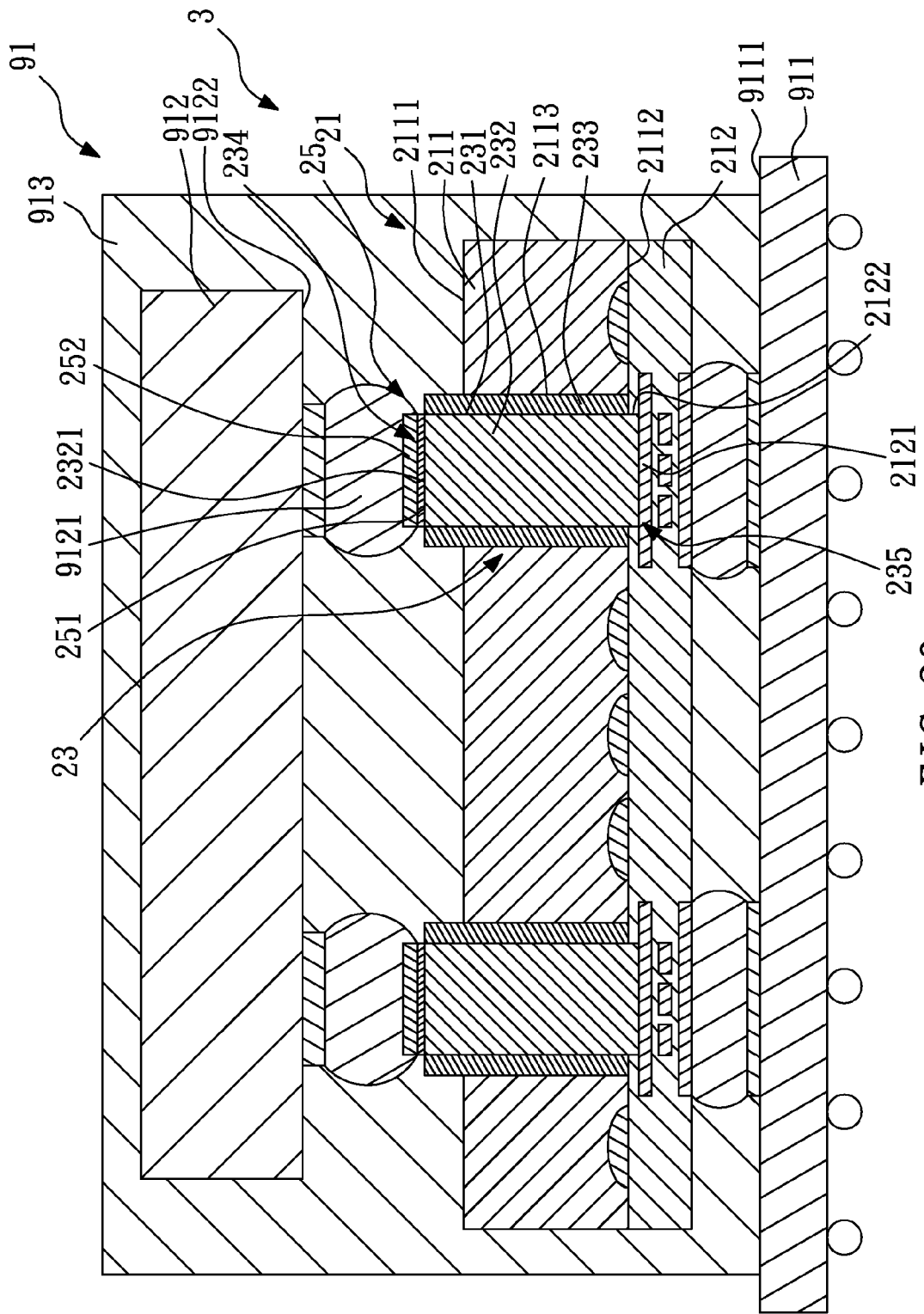
FIG. 30 is a cross-sectional view of a seventh embodiment of package having a semiconductor element with a conductive via according to the present invention.

As a result, the surface 2321 of the conductive metal 232 exposes to outside of the first surface 2111 of the silicon substrate 211, and can be stacked by a chip 912 (FIG. 30). In this embodiment, it is not necessary to from a passivation layer (not shown) and a redistribution layer (not shown) on the first surface 2111 of the silicon substrate 211. Thus the manufacture process is simplified and the manufacture cost is reduced. Further, the surface metal layer 25 can protect the conductive metal 232 from oxidization, In addition, the thickness of the first insulation layer 233 is 10 μm to 20 μm, therefore, when a chip 912 (FIG. 30) stacks on the first insulation layer 233, the solder 9121 of the chip 912 (FIG. 30) will not bleed to cause bridge.

FIGS. 20 to 23 show cross-sectional views of a method for making a semiconductor element having a conductive via according to a third embodiment of the present invention. Referring to FIG. 20, a semiconductor element 20 is provided, The semiconductor element 20 comprises a silicon substrate 211 and at least one conductive via 23. The silicon substrate 211 has a first surface 2111, a second surface 2112 and at least one hole (for example, the annular groove 2113).

The hole opens at the first surface 2111. The conductive via 23 is disposed in the hole and comprises a first insulation layer 233, a conductive metal 232 and a second insulation layer 236. The first insulation layer 233 is disposed on a sidewall of the hole and defines a first central groove 231. The conductive metal 232 is disposed in the first central groove 231 and has an annular side portion 2322 and a bottom portion 2323. The annular side portion 2322 and the bottom portion 2323 defines a second central groove 237, and the second insulation layer 236 is disposed in the second central groove 237. In this embodiment, the conductive via 23 has a first end 234 and a second end 235, and the first end 234 of the conductive via 23 is aligned with the first surface 2111 of the silicon substrate 211.

A method for making the semiconductor element 20 is described as follows. First, providing a silicon substrate 211. The silicon substrate 211 has a first surface 2111 and a second surface 2112. Then, removing part of the silicon substrate 211 from the first surface 2111 of the silicon substrate 211 to form a columnar groove (not shown) and plating a conductive metal 232 on the first surface 2111 of the silicon substrate 211, so that the conductive metal 232 is formed in the columnar groove, The method for forming the conductive metal 232 in the columnar groove is described as follows. First, sputtering the conductive metal 232 on the first surface 2111 of the silicon substrate 211, so that the conductive metal 232 is in the columnar groove and on on the first surface 2111 of the silicon substrate 211 and plating the conductive metal 232, so that the conductive metal 232 is in the columnar groove and on the first surface 2111 of the silicon substrate 211. Finally, removing the conductive metal 232 which is on the first surface 2111 of the silicon substrate 211.

The conductive metal has an annular side portion 2322 and a bottom portion 2323, the annular side portion 2322 and the bottom portion 2323 defines a second central groove 237. Removing part of the silicon substrate 211 from the first surface 2111 of the silicon substrate 211, to form an annular groove 2113. The annular groove 2113 surrounds the conductive metal 232. Finally, disposing an insulation material in the annular groove 2113 and the second central groove 237, so as to form a first insulation layer 233 and a second insulation layer 236. Meanwhile, the semiconductor element 20 is formed.

Referring to FIG. 21, a passivation layer 26 and a redistribution layer 27 is formed on the first surface 2111 of the silicon substrate 211. The passivation layer 26 has an opening 261 to expose part of the conductive via 23. The redistribution layer 27 is disposed in the opening 261 and electrically connected to the conductive via 23.

Figure 22:
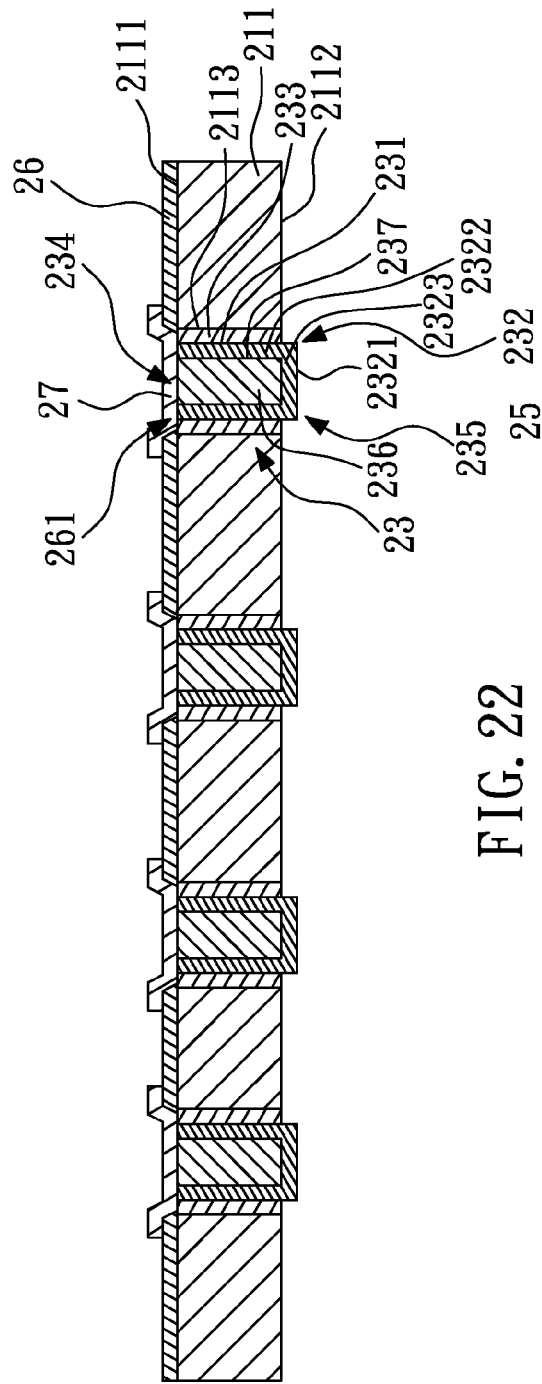
Figure 23:
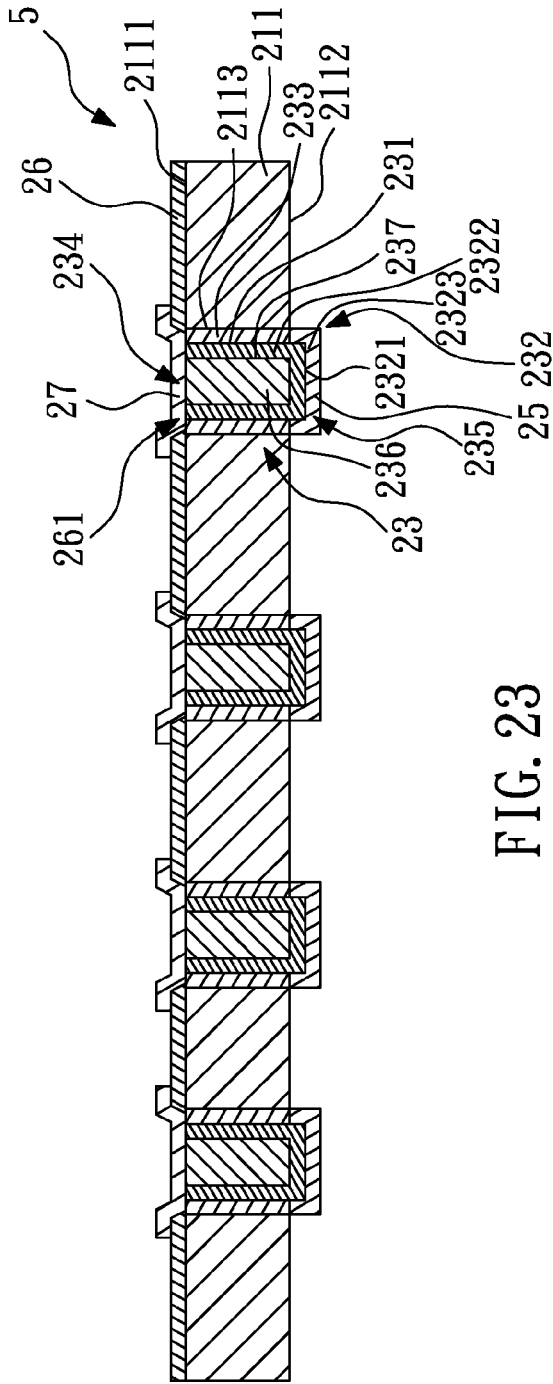

Referring to FIG. 22, part of the silicon substrate 211 is removed from the second surface 2112 of the silicon substrate 211, so as to expose a bottom surface 2321 of the bottom portion 2323. In this embodiment, the silicon substrate 211 is removed from the second surface 2112 thereof by grinding then etching until the second end 235 of the conductive via 23 protrudes from the second surface 2112 of the silicon substrate 211. However, in other embodiments, the silicon substrate 211 is removed from the second surface 2112 only by etching. Referring to FIG. 23, at least one surface metal layer 25 is formed, wherein the surface metal layer 25 is disposed on the surface 2321 of the bottom portion 2323 of the conductive metal 232 and extends to a side surface of the bottom portion 2323 of the conductive metal 232. Meanwhile, a semiconductor element 5 having a conductive via according to a third embodiment of the present invention is formed. In this embodiment, the surface metal layer 25 is a surface finish layer, and is formed by electroless plating, and the material thereof is Ni/Au. However, in other embodiments, the surface metal layer 25 is a solder layer.

FIG. 23 shows a cross-sectional view of a semiconductor element having a conductive via according to a third embodiment of the present invention. The semiconductor element 5 comprises a silicon substrate 211, at least one conductive via 23, a passivation layer 26, a redistribution layer 27 and at least one surface metal layer 25. The silicon substrate has a first surface 2111, a second surface 2112 and at least one through hole (I.e., the sidewall of the annular groove 2113). The through hole penetrates the silicon substrate 211.

The conductive via 23 penetrates the silicon substrate 211 and comprises a first insulation layer 233, a conductive metal 232 and a second insulation layer 236. The conductive via 23 has a first end 234 and a second end 235, the first end 234 of the conductive via 23 is aligned with the first surface 2111 of the silicon substrate 211, and the second end 235 of the conductive via 23 protrudes from the second surface 2112 of the silicon substrate 211. A first insulation layer 233 is disposed on a sidewall of the through hole (i.e., the sidewall of the annular groove 2113) and defines a first central groove 231. The conductive metal 232 is disposed in the first central groove 231, and has an annular side portion 2322 and a bottom portion 2323. The annular side portion 2322 and the bottom portion 2323 define a second central groove 237. A bottom surface 2321 of the bottom portion 2323 exposes to outside of the second surface 2112 of the silicon substrate 211. The bottom portion 2323 of the conductive metal 232 protrudes from the second surface 2112 of the silicon substrate 211. A second insulation layer 236 is disposed in the second central groove 237.

The passivation layer 26 is disposed on the first surface 2111 of the silicon substrate 211, and has an opening 261 to expose part of the conductive via 23. The redistribution layer 27 is disposed in the opening 261 and electrically connected to the conductive via 23. The surface metal layer 25 is disposed on the surface 2321 of the bottom portion 2323 of the conductive metal 232 and extends to a side surface of the bottom portion 2323 of the conductive metal 232. In this embodiment, the surface metal layer 25 is a surface finish layer, and the material thereof is Ni/Au. However, in other embodiments, the surface metal layer 25 is a solder layer.

Figure 24:
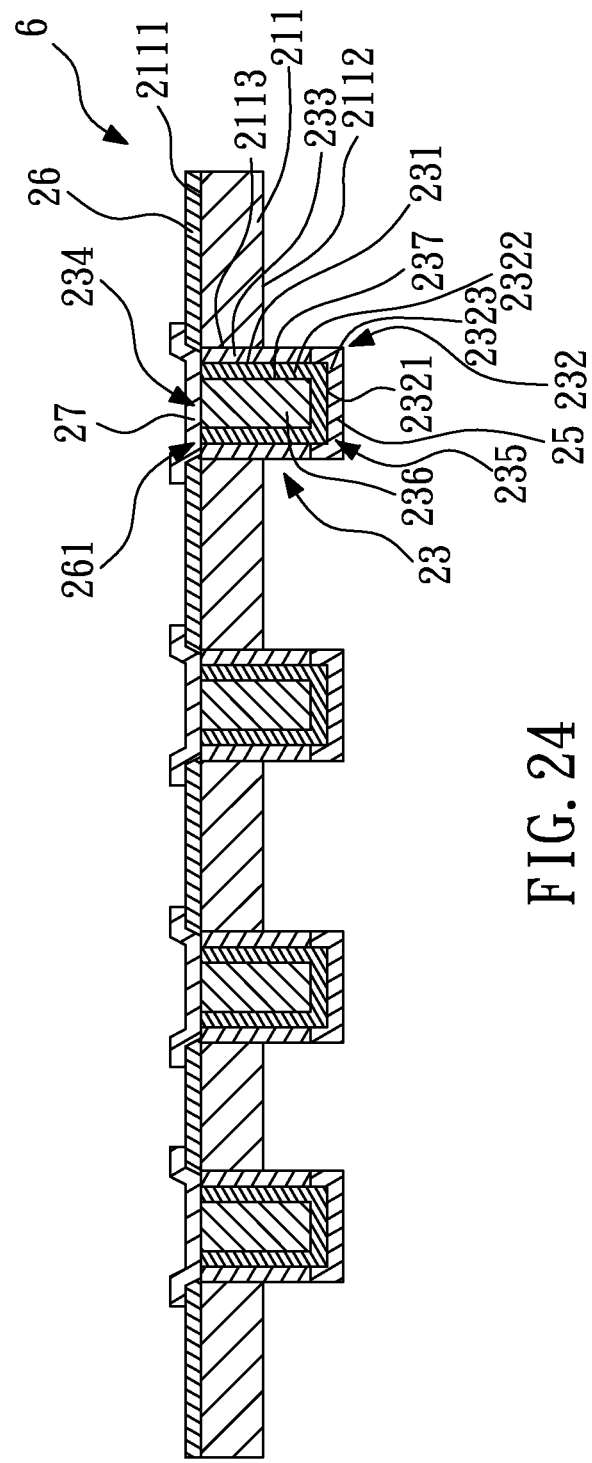
FIG. 24 is a cross-sectional view of a semiconductor element having a conductive via according to a fourth embodiment of the present invention.

FIG. 24 shows a cross-sectional view of a semiconductor element having a conductive via according to a fourth embodiment of the present invention. The semiconductor element 6 of this embodiment and the semiconductor element 5 (FIG. 23) of the third embodiment are substantially the same, and the same elements are designated with the same numerals. The difference between the fourth embodiment and the third embodiment is that part of the annular side portion 2322 of the conductive metal 232, part of the first insulation layer 233 and part of the second insulation layer 236 further protrude from the second surface 2112 of the silicon substrate 211.

FIGS. 25 to 28 show cross-sectional views of a method for making a semiconductor element having a conductive via according to a fifth embodiment of the present invention. The method for making a semiconductor element of this embodiment and the method of the third embodiment (FIGS. 20 to 23) are substantially the same, and the same elements are designated with the same numerals. The difference between this embodiment and the third embodiment is that the first insulation layer 233 further contacts the bottom portion 2323 of the conductive metal 232.

FIG. 28 shows a cross-sectional view of a semiconductor element having a conductive via according to a fifth embodiment of the present invention. The semiconductor element 7 of this embodiment and the semiconductor element 5 (FIG. 23) of the third embodiment are substantially the same, and the same elements are designated with the same numerals. The difference between this embodiment and the third embodiment is that the first insulation layer 233 further contacts the bottom portion 2323 of the conductive conductive metal 232.

Figure 29:
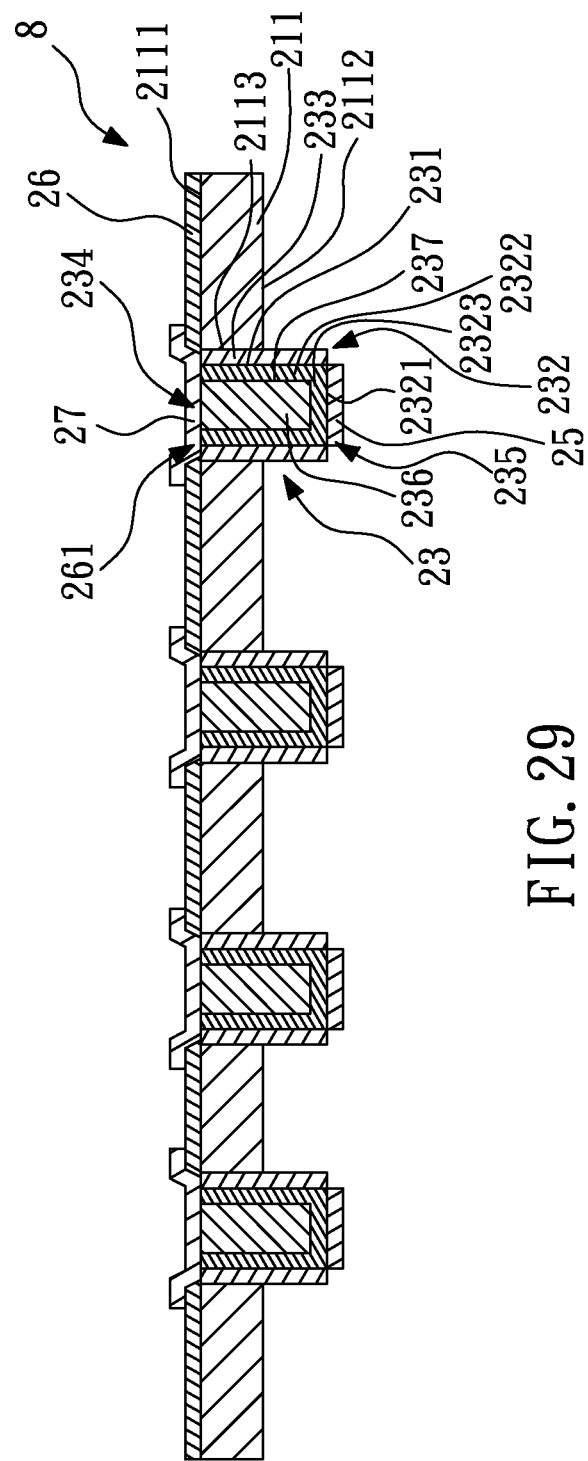
FIG. 29 is a cross-sectional view of a semiconductor element having a conductive via according to a sixth embodiment of the present invention.

FIG. 29 shows a cross-sectional view of a semiconductor element having a conductive via according to a sixth embodiment of the present invention. The semiconductor element 8 of this embodiment and the semiconductor element 7 (FIG. 28) of the fifth embodiment are substantially the same, and the same elements are designated with the same numerals. The difference between this embodiment and the fifth embodiment is that the second end 235 of the conductive via 23 protrudes from the second surface 2112 of the silicon substrate 211, and the bottom portion 2323 of the conductive metal 232, part of the annular side portion 2322 of the conductive metal 232, part of the first insulation layer 233 and part of the second insulation layer 236 protrude from the second surface 2112 of the silicon substrate 211.

Figure 32:
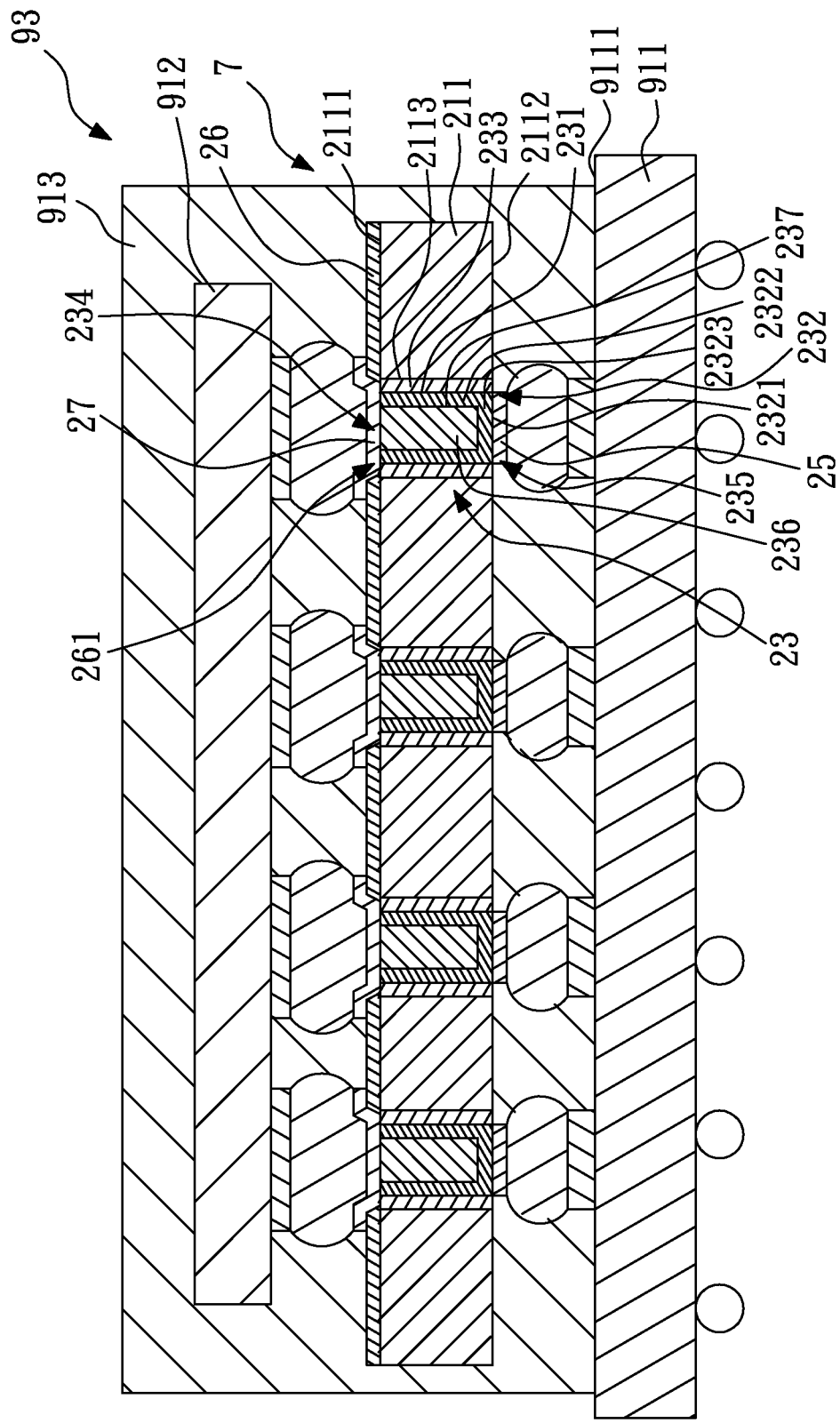
FIG. 32 is a cross-sectional view of a ninth embodiment of package having a semiconductor element with a conductive via according to the present invention.

As a result, the bottom surface 2321 of the bottom portion 2323 of the conductive metal 232 exposes to outside of the second surface 2112 of the silicon substrate 211, and can he stacked on a carrier 911 (FIG. 32). It is not necessary to from a passivation layer and a redistribution layer on the second surface 2112 of the silicon substrate 211, thus the manufacture process is simplified and the manufacture cost is reduced. In addition, the present invention can avoid the low yield rate caused by the low bonding force between the redistribution layer on the first surface 2111 and the second surface 2112 of the silicon substrate 211 in the prior art. Further, the surface metal layer 25 can protect the conductive metal 232 from oxidization.

FIG. 30 shows a cross-sectional view of a seventh embodiment of package having a semiconductor element with a conductive via according to the present invention. The package 91 comprises at least one carrier 911, a semiconductor element, at least one chip 912 and a molding compound 913. In this embodiment, the carrier 911 is a silicon substrate or an organic substrate. The semiconductor element is the semiconductor element 3 (FIGS. 18 to 19) having a conductive via according to a second embodiment of the present invention. However, in other embodiments, the semiconductor element 3 can turn over 180 degrees, or the semiconductor element can be replaced by the semiconductor element 2 (FIGS. 16 to 17) having a conductive via according to a first embodiment of the present invention.

The semiconductor element 3 is disposed on the carrier 911. The chip 912 is disposed on the semiconductor element 3 and electrically connected to the carrier 911 by the conductive metal 232 of the conductive via 23.

The molding compound 913 covers a first surface 9111 of the carrier 911, the semiconductor element 3 and the chip 912. However, in other embodiments, the package 91 further comprises an underfill (not shown). The underfill covers part of the first surface 2111 of the silicon substrate 211 and part of an active surface 9122 of the chip 912, and the molding compound 913 covers a first surface 9111 of the carrier 911, the semiconductor element 3 and the chip 912. Alternatively, the package 91 may not comprises the molding compound 913, but comprises the underfill that covers part of the first surface 2111 of the silicon substrate 211 and part of an active surface 9122 of the chip 912.

Figure 31:
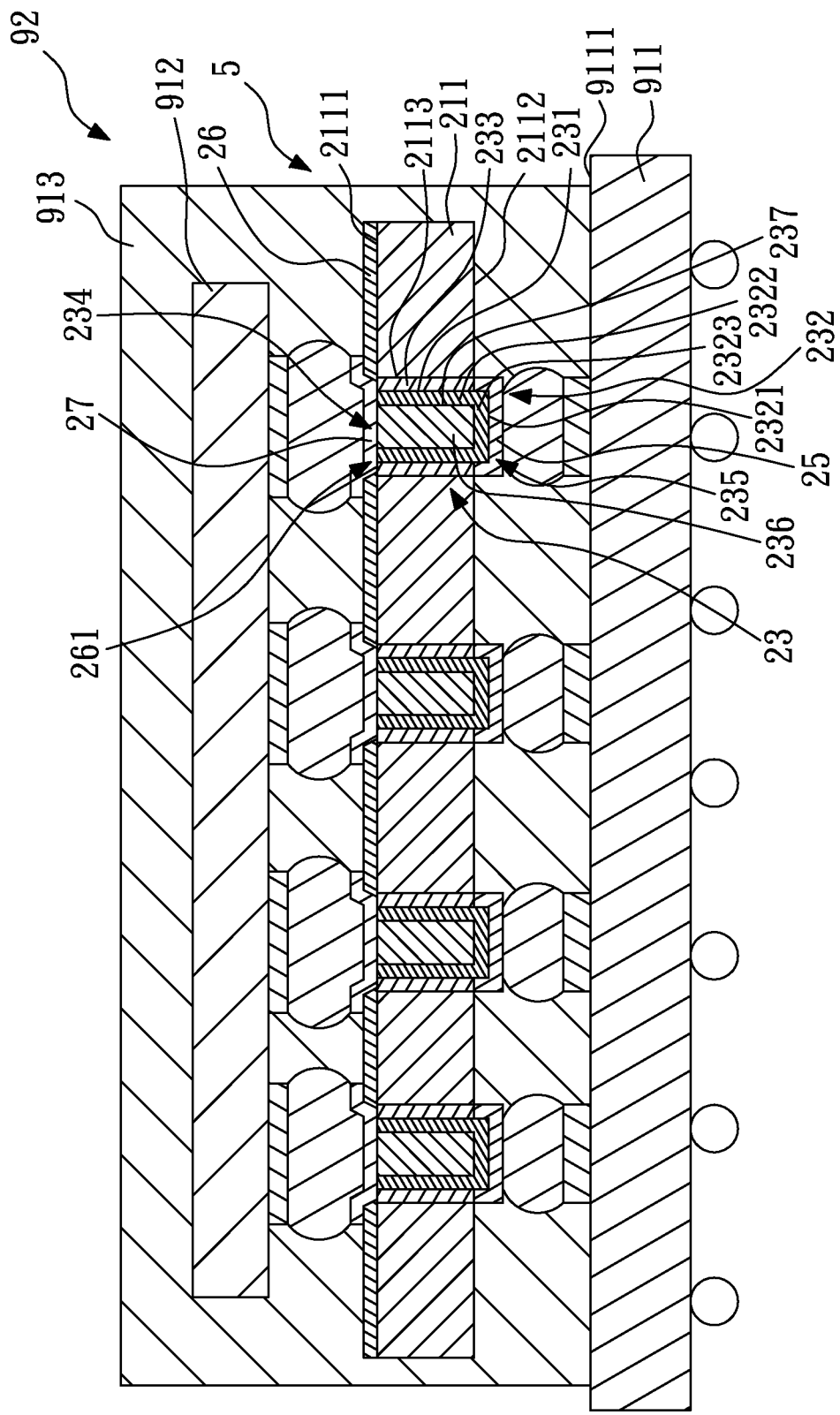
FIG. 31 is a cross-sectional view of a eighth embodiment of package having a semiconductor element with a conductive via according to the present invention.

FIG. 31 shows a cross-sectional view of a eighth embodiment of package having a semiconductor element with a conductive via according to the present invention. The package 92 comprises at least one carrier 911, a semiconductor element, at least one chip 912 and a molding compound 913. In this embodiment, the semiconductor element is the semiconductor element 5 (FIG. 23) having a conductive via according to a third embodiment of the present invention. However, in other embodiments, the semiconductor element 5 can turn over 180 degrees, or the semiconductor element can be replaced by the semiconductor element 6 (FIG. 24) having a conductive via according to a fourth embodiment of the present invention. The semiconductor element 5 is disposed on the carrier 911. The chip 912 is disposed on the semiconductor element 5 and electrically connected to the carrier 911 by the conductive metal 232 of the conductive via 23. The molding compound 913 covers a first surface 9111 of the carrier 911, the semiconductor element 5 and the chip 912.

FIG. 32 shows a cross-sectional view of a ninth embodiment of package having a semiconductor element with a conductive via according to the present invention. The package 93 comprises at least one carrier 911, a semiconductor element, at least one chip 912 and a molding compound 913. In this embodiment, the semiconductor element is the semiconductor element 7 (FIG. 28) having a conductive via according to a fifth embodiment of the present invention. However, in other embodiments, the semiconductor element 7 can turn over 180 degrees, or the semiconductor element can be replaced by the semiconductor element 8 (FIG. 29) having a conductive via according to a sixth embodiment of the present invention. The semiconductor element 7 is disposed on the carrier 911. The chip 912 is disposed on the semiconductor element 7 and electrically connected to the carrier 911 by the conductive metal 232 of the conductive via 23. The molding compound 913 covers a first surface 9111 of the carrier 911, the semiconductor element 7 and the chip 912.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as forms as illustrated, and that all modifications which maintain the spirit and scope of the present invention are within the scope defined by the appended claims.

What is claimed is:

1. A method for making a semiconductor element having a conductive via, comprising the following steps:
   (a) providing a silicon chip comprising a silicon substrate and an active circuit layer, the silicon substrate having a first surface and a second surface, the active circuit layer being disposed on the second surface of the silicon substrate, and having at least one metal layer;
   (b) removing part of the silicon substrate and part of the active circuit layer from the first surface of the silicon substrate, to form at least one columnar groove and at least one opening, respectively, the columnar groove penetrating the silicon substrate, and the opening exposing part of the metal layer;
   (c) forming a conductive metal in the columnar groove and the opening, the conductive metal being electrically connected to the metal layer of the active circuit layer, and a surface of the conductive metal exposing to outside of the first surface of the silicon substrate;
   (d) removing part of the silicon substrate from the first surface of the silicon substrate, to form at least one annular groove, the annular groove penetrating the silicon substrate and surrounding the conductive metal; and
   (e) forming a first insulation layer in the annular groove, so that the conductive metal and the first insulation layer forming at least one conductive via.

2. method as claimed in claim 1, further comprising the following steps in the step (b):
   (b1) forming a first photo-resist layer on the first surface, the first photo-resist layer has a first opening to expose part of the first surface;
   (b2) removing part of the silicon substrate from the first surface of the silicon substrate; and
   (b3) removing the second photo-resist layer.

3. The method as claimed in claim 1, further comprising the following steps in the step (d):
   (d1) forming a second photo-resist layer on the first surface, the second photo-resist layer has a second opening to expose part of the first surface;
   (d2) removing part of the silicon substrate and part of the active circuit layer from the first surface of the silicon substrate; and
   (d3) removing the first photo-resist layer.

4. The method as claimed in claim 1, wherein in the step (e) the conductive via has a first end and a second end, the first end of the conductive via is aligned with, the first surface of the silicon substrate.

5. The method as claimed in claim 4, further comprising a step of removing part of the silicon substrate after the step (e), wherein the first end of the conductive via protrudes from the first surface of the silicon substrate.

6. The method as claimed in claim 1, further comprising a step of forming at least one surface metal layer after the step (e), wherein the surface metal layer is disposed on the surface of the conductive metal.

* * * * *